US009105712B1

(12) United States Patent
Levy et al.

(10) Patent No.: US 9,105,712 B1
(45) Date of Patent: Aug. 11, 2015

(54) DOUBLE RESURF LDMOS WITH SEPARATELY PATTERNED P+ AND N+ BURIED LAYERS FORMED BY SHARED MASK

(71) Applicant: Tower Semiconductor Ltd., Migdal Haemek (IL)

(72) Inventors: Sagy Levy, Zichron-Yaakov (IL); Jolly Gurvinder, Newport Beach, CA (US); Sharon Levin, Haifa (IL)

(73) Assignee: Tower Semiconductors Ltd., Migdal Haemek (IL)

( * ) Notice: Subject to any disclaimer, the term of this patent is extended or adjusted under 35 U.S.C. 154(b) by 0 days.

(21) Appl. No.: 14/475,486

(22) Filed: Sep. 2, 2014

(51) Int. Cl.
*H01L 21/33* (2006.01)
*H01L 21/82* (2006.01)
*H01L 29/78* (2006.01)
*H01L 29/772* (2006.01)

(52) U.S. Cl.
CPC .............. *H01L 29/78* (2013.01); *H01L 29/772* (2013.01)

(58) Field of Classification Search
CPC ......... H01L 29/78; H01L 29/66; H01L 21/33; H01L 21/82; H01L 29/73
USPC ................ 438/282–286, 422, 335, 294, 197; 257/66, 75, 141, 288, 336–343, 368, 257/378, 565, E29.187, E21.409, E21.373, 257/E29.001–E29.003
See application file for complete search history.

(56) References Cited

U.S. PATENT DOCUMENTS

| | | | |
|---|---|---|---|
| 6,869,851 B2 | 3/2005 | Trogolo et al. | |
| 2005/0167756 A1* | 8/2005 | Lotfi et al. | 257/369 |
| 2009/0256199 A1* | 10/2009 | Denison et al. | 257/343 |
| 2010/0052052 A1* | 3/2010 | Lotfi et al. | 257/336 |
| 2011/0049621 A1* | 3/2011 | Lotfi et al. | 257/337 |
| 2011/0133818 A1 | 6/2011 | Matsudai et al. | |
| 2013/0075741 A1* | 3/2013 | Mallikarjunaswamy et al. | 257/66 |
| 2013/0075746 A1* | 3/2013 | Mallikarjunaswamy et al. | 257/75 |
| 2013/0161689 A1* | 6/2013 | Huo et al. | 257/141 |
| 2014/0231911 A1* | 8/2014 | Kim et al. | 257/339 |
| 2014/0291767 A1* | 10/2014 | Lee et al. | 257/368 |

OTHER PUBLICATIONS

Parthasarathy, V. "A Double RESURF LDMOS with Drain Profile Engineering for Improved ESD Robustness," IEEE Electron Device Letters, vol. 23, No. 4, Apr. 2002, pp. 212-214.

* cited by examiner

*Primary Examiner* — Amar Movva
*Assistant Examiner* — Sheikh Maruf
(74) *Attorney, Agent, or Firm* — Bever, Hoffman & Harms, LLP

(57) ABSTRACT

A double-RESURF LDMOS fabrication method utilizes a shared mask to form separately patterned N+ buried layer (NBL) and P+ buried layer (PBL) regions. The mask includes two opening types (e.g., large and small), and the P-type and N-type implant materials are separately directed onto the mask at different implant angles, such that the N-type implant passes through both opening types to form a first pattered implant region in both a first region and a surrounding second region, and such that the P-type implant material passes only through the larger openings and forms a second pattered implant region only in the first substrate portion. An optional epitaxial layer is deposited over the substrate and annealed to form the separately patterned PBL and NBL in the epitaxial layer, where a portion of the PBL diffuses above the NBL and forms a P-surf region below the LDMOS's N-drift region.

21 Claims, 15 Drawing Sheets

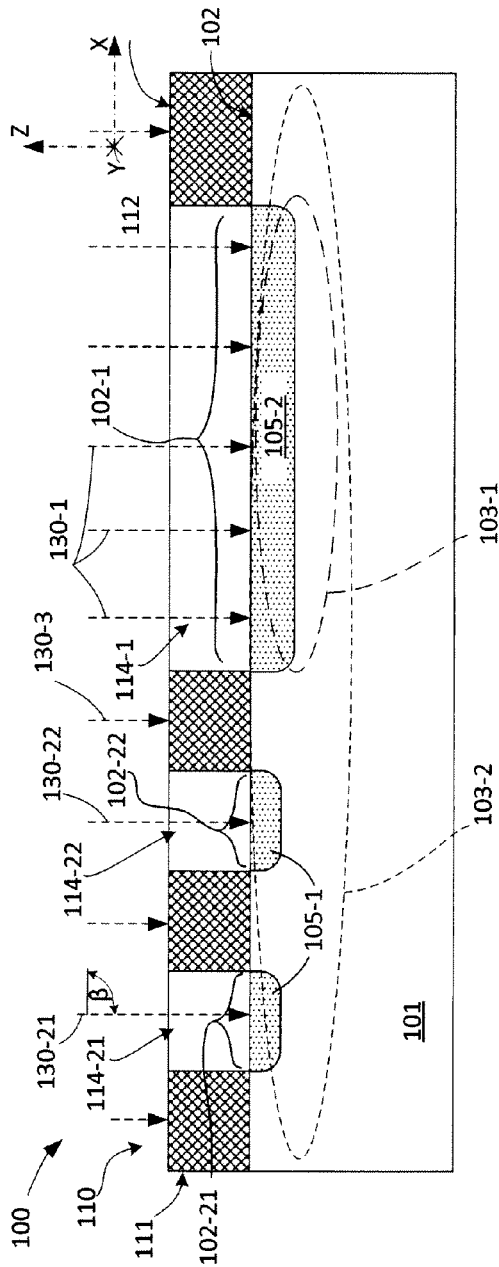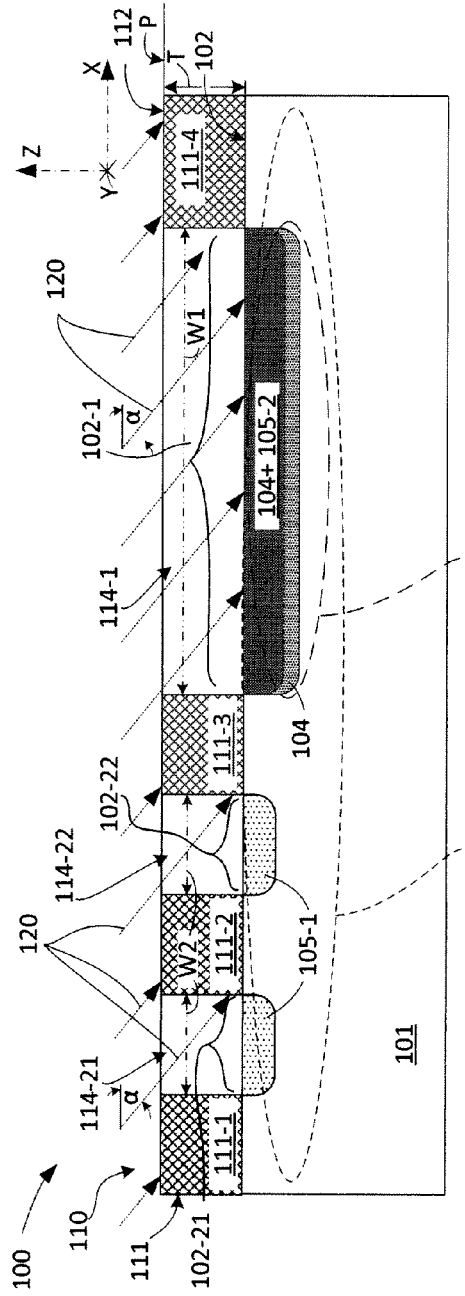

DOUBLE RESURF LDMOS WITH SEPARATELY PATTERNED P+ AND N+ BURIED LAYERS FORMED BY SHARED MASK

BACKGROUND OF THE INVENTION

1. Field of the Invention

The present invention relates to a double-RESURF-type lateral diffused MOSFET (LDMOS) transistor having separately patterned N-type and P-type buried layers, and particularly to a method for fabricating such double-RESURF LDMOS transistors using a single "shared" mask.

2. Related Art

RESURF (Reduced Surface Field) technology is one of the most widely used methods in Power management applications for providing high voltage (HV) transistors exhibiting both a high break down voltage (BV) and a low specific resistance ($R_{DSON}$). The RESURF technique is achieved by placing a PN junction below the extended drain in a LDMOS transistor such that a depletion layer extending from the PN junction reaches the device surface, and as a result the BV of the device is increased significantly. The RESURF technique involves forming laterally diffused metal oxide semiconductor (LDMOS) transistors in a relatively thin layer of epitaxial layer, which is less time consuming to produce, and the resulting "RESURF LDMOS" transistors having a much higher BV and lower $R_{DSON}$ than conventional vertical power transistors.

FIG. 7 is a cross sectional view of a conventional double-RESURF LDMOS transistor 30. The phrase "double RESURF" refers to a technique used to enhance the BV of an LDMOS transistor while maintaining a low $R_{DSON}$, or in other words to increase the BV-to-$R_{DSON}$ ratio. The double RESURF technique involves depleting the extended drain area in an LDMOS from two sides, for example, from the bottom and from the top in y direction, forming a drift layer (N-DRIFT) below the gate oxide. In practice, as indicated in FIG. 7, the depletion of the drift layer from two directions is achieved by forming a lower PN junction (referred to as "PN junction below") below the deep N-well that serves to deplete the drift layer region from the bottom, and placing a polycrystalline silicon gate (referred to as "drift poly") on top of the oxide that forms part of the drift layer (extended drain area) and serves to deplete the extended drain from the top. The direction of the depletion layers extending from the top and bottom are indicated by the dashed-line arrows marked "TOP" and "BOTTOM" in FIG. 7, respectively. Although these depletions are applied from vertical "sides" (i.e., top and bottom), these depletions result in a horizontal electrical field. The key point of depleting the drift region from two sides is the shape of this horizontal electrical field. Specifically, by depleting the drift region from two sides, a double RESURF LDMOS has a constant electrical field with a rectangular shape, in comparison to the electric field generated in single RESURF LDMOS, which has a linear triangular shape. The rectangular shape of the horizontal field gives double RESURF LDMOS transistors a much higher BV compared to comparable single RESURF LDMOS transistors having the triangular shaped electrical field generated by single RESURF. Double RESURF therefore provides much higher BV for a given geometry and doping level (i.e., for a given BV, a transistor formed using double RESURF technology has much smaller geometry (footprint) than a transistor formed by single RESURF technology). In other words, double RESURF technology allows much lower $R_{DSON}$ (e.g., as low as 50%-60%) in comparison to single RESURF technology.

An issue associated with the use of RESURF LDMOS transistors in high current applications involving inductive loads is that unwanted current injection to the substrate is generated by way of a parasitic bipolar transistor formed by the body/deep-N-well/substrate regions of the RESURF LDMOS transistor. To avoid the excess minority injection causing this parasitic bipolar, a common practice is to use an N+ buried layer (NBL) formed under the entire deep-N-well region in which the LDMOS transistor is formed (i.e., in the region where the the epitaxial layer meets the base underlying substrate). Although such LDMOS transistors with NBL are superior to earlier LDMOS transistors in high current applications, the NBL acts to reduce the BV, and also results in higher $R_{DSON}$ for a given breakdown voltage.

Conventional double-RESURF LDMOS transistor 30 (FIG. 7) also illustrates a recent methodology that takes advantage of the NBL isolation while maintaining high BV is to form a P+ buried layer (P-Well) in the epitaxial layer between the NBL and the deep N-well located below the LOCOS gate oxide and containing the drain portion of the LDMOS. The P-Well serves to gain back the desired high BV for devices having smaller geometries by inducing depletion in the drift region of the epitaxial layer, and is formed by implanting ions of an P-type material (e.g., Boron (B)) in the semiconductor substrate of the device over a portion of the NBL, and then updiffusing the P-type ions into an epitaxial layer to provide the desired position of the P-well between the NBL and a N-well containing the drain portion of the LDMOS. A problem with this approach is that it requires the use of a complicated boron implant process that utilizes extra high energy from the top of the device to be buried below the deep N-well, as disclosed in "A Double RESURF LDMOS With Drain Profile Engineering for Improved ESD Robustness" by V Parthasarathy Et Al, in IEEE ELECTRON DEVICE LETTERS, VOL. 23, NO. 4, APRIL 2002 p 212. The Boron, which forms the PBL, is implanted with the Antimony (Sb) that forms the NBL, and diffuses faster than the Sb, and so desirably forms the PBL between the deep N-well and the NBL. However, the process requires the formation of two separate masks having specific thicknesses in order to effectively implant the Boron and Sb at the proper dosages and depths such that they form the required PBL and NBL regions.

Another problem associated with the conventional approach of implanting a PBL from the top is that it is very difficult to scale the implant process for higher voltages. That is, in the prior art case to scale the voltage deeper more energetic implant is needed and is also limited. Yet another problem associated with the conventional approach is that patterning the P-well below the N-well (extended drain implant) is either restricted to the layout of the extended drain or requires an extra mask. That is, it is important to be able to pattern the PBL (independently from the NBL) in order to optimize the BV Vs. $R_{DSON}$ characteristics of the cell due to interactions between the drift layer and the source side and drain side affecting the resulting BV and $R_{DSON}$, and requiring this degree of freedom for simultaneous optimization of BV and $R_{DSON}$.

What is needed is a method for producing an improved double-RESURF LDMOS transistor having a P-type buried layer that addresses the problems set forth above. What is particularly needed is a cost effective and reliable method for generating double-RESURF LDMOS transistors having separately patterned N-type and P-type buried layers, with the NBL optimized for isolation purposes (i.e., to "kill" the parasitic bipolar) and the PBL optimized for improving the BV and $R_{DSON}$, that can be incorporated into a standard process flow with minimal modifications.

SUMMARY

The present invention is directed to a method for generating double-RESURF NLDMOS transistor in which a P+ buried layer is implanted through the same (shared) mask that is used to form the N+ buried layer, where a portion of the P+ buried layer up-diffuses to form a P-surf region between the N+ buried layer and the N-drift (source/drain/channel) region, thereby providing a NLDMOS switching transistor having a higher BV and lower than benchmark $R_{DSON}$ for the same footprint size using a cost-effective method. The shared mask is formed on the base (e.g., monocrystalline silicon) substrate, and is patterned to define a two-part opening arrangement including both a large opening and several small openings disposed over respective regions of a base (e.g., monocrystalline silicon) substrate. The two (i.e., N-type and P-type) implants are then performed with the two implant materials directed onto the mask at different angles (e.g., by repositioning the substrate relative to the ion beam direction between the N-type and P-type implant processes). The P-type implant is performed at an acute angle (e.g., in the range of 22° to 65° relative to mask's upper surface) that allows the P-type implant material to pass through the large opening and to form a P-type diffusion (implant) region in the first substrate region, but such that the resist material walls surrounding the smaller openings prevent (i.e., block) the P-type material from entering the second substrate regions. In contrast, the N-type implant material is directed at a substantially perpendicular angle (e.g., in the range of 0° to 7° relative to the mask) that allows it to pass through both the large opening and the small openings into the exposed substrate surface. Subsequent annealing causes the implant material to diffuse laterally under the mask material walls, whereby the merged N-type material forms a continuous N-type diffusion (implant) region in both the first and second substrate regions, (i.e., such that the N-type implant region is larger than and "overlaps" the P-type implant region). The shared mask thus reduces manufacturing costs by eliminating the formation and removal of separate masks typically needed to form two separately patterned implants, and may also improve production yields and device performance by providing more precise positioning of the separately patterned N-type and P-type implants than may be achieved using two or more separate masks (i.e., by way of conventional methods). In addition, the shared mask facilitates forming N-type (or P-type) implant regions of essentially unlimited size by causing the N-type implant material to merge under the mask walls to form continuous diffusions having areas that are multiple times larger than the size of each smaller opening. An epitaxial layer is then formed on the base substrate over the separately patterned N-type and P-type diffusions, and then the substrate is annealed such that the P-type and N-type implant materials diffuse upward into the epitaxial layer to form the desired N+ and P+ buried layer arrangement. According to an aspect of the invention, the N-type and P-type implant materials are selected, implanted and annealed such that the selected P-type material (e.g., Boron) diffuses into the epitaxial layer at a faster rate than the selected N-type material (e.g., Antimony), whereby the P-type implant material forms a P+ buried layer that overlaps a portion of the N+ buried layer, with a portion of the P-type implant material forming a P-surf region in the epitaxial layer above the N+ buried layer portion (i.e., between the N+ buried layer and the subsequently formed deep N-well in which the remainder of the NLDMOS is formed). The P-surf region, which facilitates both the high breakdown voltage (BVdss) and a low specific resistance ($R_{DSON}$) that are characteristic of double-RESURF LDMOS devices, is thus provided in a highly reliable and cost-effective manner.

According to an embodiment of the invention, the shared mask includes a resist material layer that is patterned to include both a larger rectangular (first) opening disposed over a first substrate region, and several substantially-square "cell-type" smaller (second) openings disposed in an array pattern (i.e., arranged in a rows-and-columns pattern) over a second region of the substrate. The use of "cell-type" smaller (second) openings facilitates forming the desired separately patterned implant regions independent of the implant direction. Each smaller opening has length/width dimensions determined by an opening size (width) that would block ions implanted through a resist layer having a particular thickness for a particular implant angle and a particular implant energy.

According to another embodiment of the invention, a shared mask is utilized to form an N-well region, a P-surf region and an N-drift region using three separate implants either into an optional epitaxial (epi) layer or directly into a semiconductor substrate. In the epi embodiment, an optional N+ buried layer implant is first formed in a base semiconductor substrate using a first mask, then the epitaxial layer is deposited over the N+ buried layer implant, and then an optional sinker implant to the N+ buried layer is formed through the epi layer using a second mask. The shared mask is then formed on the epi layer as described above, and then the three implants are formed using two N-type implants to form the N-well and N-drift regions, and a P-type implant to form the P-surf region. Specifically, a first N-type material is implanted at an implant angle in the range of 0-7° at high energy such that the N-type material passes through both large and small openings to form an N-well region in both a first region of the epitaxial layer under the smaller openings, and in a second region of the epitaxial layer under the larger opening. A P-type implant material is then directed at an implant angle in the range of 22-65° such that the P-type implant material only passes through the smaller openings at an implant energy selected such that the P-type implant material forms a P-surf region in the first region of the epitaxial layer (i.e., in the N-well region). A third implant process is then performed by directing a second N-type implant material at an implant angle in the range of 22-65° and at a relatively low implant energy such that the second N-type implant material forms an N-drift region only in the first region of the epi layer and over the P-surf region. This approach facilitates fabricating double-RESURF LDMOS transistors without requiring separate masks for implanting/forming the P-surf and N-drift regions. In an alternative embodiment, the three implants are formed directly into a semiconductor substrate (i.e., without forming an N+ buried layer).

BRIEF DESCRIPTION OF THE DRAWINGS

These and other features, aspects and advantages of the present invention will become better understood with regard to the following description, appended claims, and accompanying drawings, where:

FIGS. 3(A), 3(B), 3(C), 3(D), 3(E), 3(F), 3(G), 3(H), 3(I), 3(J), 3(K), 3(L), 3(M), 3(N), 3(O), 3(P), and 3(Q) are simplified cross sectional views of a double-RESURF LDMOS transistor during various stages of fabrication in accordance with another embodiment of the present invention;

DETAILED DESCRIPTION

The present invention relates to an improved LDMOS structure and fabrication method. The following description is presented to enable one of ordinary skill in the art to make and use the invention as provided in the context of a particular application and its requirements. As used herein, directional terms such as "above", "below", "upper", "lower", "vertical", and "horizontal" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
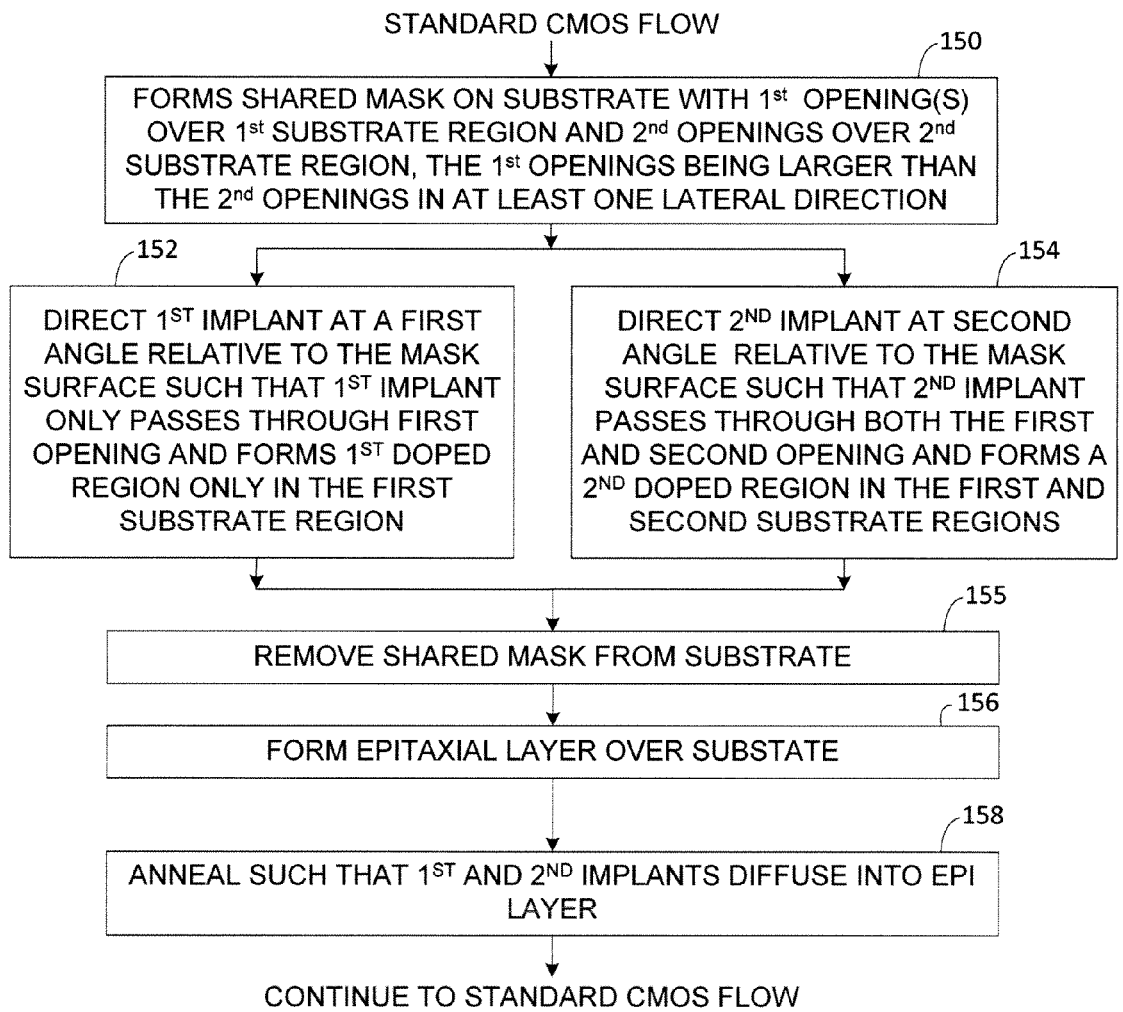
FIG. 1 is a simplified flow diagram showing a generalized method for producing a double-RESURF LDMOS transistor according to an embodiment of the present invention.

FIG. 1 is flow diagram illustrating the present invention in a generalized exemplary form in which the novel method is incorporated into an otherwise-standard photolithographic (e.g., CMOS) process flow utilized to produce an N-type laterally diffused metal oxide semiconductor (NLDMOS) device. Specifically, according to an aspect of the invention, the present invention involves modifying the otherwise-standard process flow to provide a special "shared" mask (block 150), then forming two separately patterned implant regions using the shared mask (blocks 152 and 154) followed by standard epitaxial deposition (block 156), and then performing a special annealing process (block 158) to cause the two separately patterned implant regions to form a precisely patterned P+ buried layer (PBL) over a larger N+ buried layer located at the bottom of the N-well in which the NLDMOS device is formed. That is, the present invention involves the non-standard process of utilizing the shared mask in the manner described in detail below to produce two overlapping but separately patterned implants, in contrast to using one "dedicated" mask per implant/diffusion per the conventional implant/diffusion technique, and by including a modified annealing process that forms the desired PBL and NBL positioning in the epitaxial layer. The present invention is believed to otherwise be entirely compatible with standard photolithographic process flows, such as the 0.18μ CMOS Process Flow performed by Tower Semiconductor, Ltd. of Migdal Haemek, Israel. The shared mask thus reduces manufacturing costs by eliminating the formation and removal of one or more masks from the otherwise-standard process flow, and may also improve production yields and device performance by providing more precise positioning of the separately patterned implants than may be achieved using two or more separate masks (i.e., by way of conventional methods). The phrase "otherwise-standard process flow" is therefore used herein to describe, for example, an existing "standard" CMOS process flow used to produce integrated circuits, where the method described herein is used in place of the conventional multiple-mask implant/diffusion technique. Because the present invention reduces the number of process steps (i.e., those associated with the formation and removal of one or more additional masks) and provides the additional benefits described herein without requiring significant thermal budget changes, the present invention is easily incorporated into a standard photolithographic (e.g., CMOS) process flow to provide a desirably modified otherwise-standard photolithographic process flow that reduces the overall manufacturing costs associated with the production of electronic devices, such as the exemplary NLDMOS described below.

The flow diagram of FIG. 1 will now be described in additional detail with reference to a simplified exemplary embodiment shown in FIGS. 2(A) to 2(C) and 3(A) to 3(Q), which depict various stages of a process for fabricating an NLDMOS transistor using an otherwise-standard CMOS process flow.

Figure 2A:
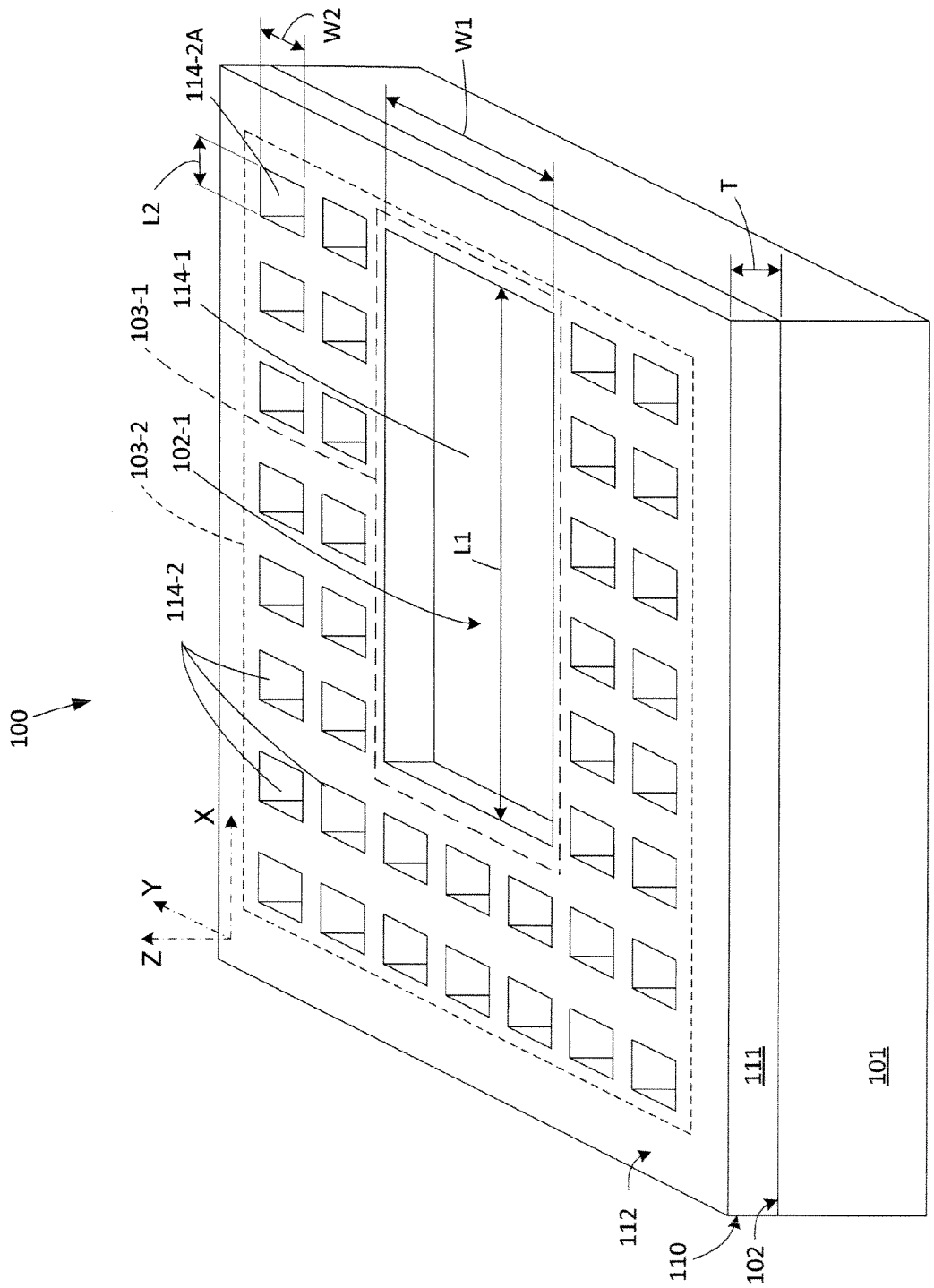
FIGS. 2(A), 2(B) and 2(C) are simplified perspective views showing a simplified shared mask utilized to produce a double-RESURF LDMOS transistor in accordance with an exemplary embodiment of the present invention.

Referring to the upper portion of FIG. 1, the described method is performed after standard initial CMOS processing typically performed to prepare a host substrate for photolithographic processing. Referring to FIG. 2(A), in the exemplary embodiment the various semiconductor structures formed during the NLDMOS fabrication process described below are formed on "base" semiconductor substrate 101, which comprises p-type monocrystalline silicon. In an alternative embodiment, base substrate 101 may comprise epitaxial material formed over a third substrate (not shown). Moreover, substrate 101 may have an n-type conductivity in an alternate embodiment. Zero layer (ZL) lithography and etch steps (not shown) are performed, thereby forming a pattern of trenches (having an exemplary depth of 1200 Angstroms) that acts as a marking layer for alignment purposes during subsequent process steps.

Referring to block 150 near the top of FIG. 1 and to FIG. 2(A), the CMOS process flow modifications begin with forming a shared mask 110 on substrate 101 by depositing a mask material (e.g., photoresist) layer 111 on upper substrate surface 102, and then patterning resist layer 111 using known techniques to define two type of openings: at least one "larger" (first) opening 114-1 that is disposed over a first region 103-1 of substrate 101, and several "smaller" openings 114-2 that are disposed over a second region 103-2 of substrate 101. The terms "opening" and "openings" in this context refer to voids in the resist layer that are entirely surrounded (e.g., on four sides in the case of square or rectangular openings) by retained resist material of the resist material layer that do not contain any purposefully retained resist material, thus distinguishing the terms "opening" and "openings" from elongated slots that define islands of retained resist material, such as those taught by Matsudai et in published US application number US 2011/0133818 A1. According to an aspect of the invention, first opening 114-1 is larger than each of smaller (second) openings 114-2 in at least one lateral (orthogonal) direction. This aspect is satisfied if, e.g. as indicated in FIG. 2(A), a length L1 of first opening 114-1, as measured in an arbitrarily established lateral (i.e., parallel to the substrate surface) "X-axis" direction, is larger than a length L2 of each and every second opening 114-2 dimension measured in the X-axis direction (e.g., as indicated by opening 114-2A in the upper right corner of FIG. 2(A)). Alternatively, this aspect is satisfied if a width W1 of first opening 114-1 measured in an orthogonal lateral "Y-axis" direction is larger than a width W2 of each and every second opening 114-2 measured in the Y-axis direction. Of course, the aspect is satisfied if both length L1 and width W1 of first opening 114-1 are larger than length L2 and width W2, respectively, of each and every second opening 114-2.

In the exemplary embodiment shown in FIGS. 2(A) and 3(A), mask 110 is patterned to include a single larger rectangular opening 114-1 disposed over a first region 103-1, and several substantially square "cell-type" smaller (second) openings 114-2 disposed in an array pattern (i.e., arranged in a rows-and-columns pattern) over a second region 103-2 of substrate 101. As shown in FIG. 3(A), larger opening 114-1 extends entirely through resist material layer 111 (i.e., from upper mask surface 112 to upper substrate surface 102), and exposes a substrate surface region 102-1 located over first substrate region 103-1. Similarly, each smaller opening 114-2 extends entirely through resist material layer 111 and exposes a corresponding substrate surface region that is located over second region 103-2 (e.g., as indicated in FIG. 3(A), smaller openings 114-21 and 114-22 expose surface region portions 102-21 and 102-22, respectively). In this example, larger opening 114-1 is larger than each of second openings 114-2 in all orthogonal directions (e.g., in both the X-axis and Y-axis directions).

Referring back to FIG. 1, first and second ion implant processes are then performed through the shared mask as indicated in blocks 152 and 154. In accordance with an aspect of the present invention, the shared mask is not removed from the substrate until the first and second ion implant processes are both completed (as indicated in block 155). That is, the resist material deposited and patterned in block 150 remains intact over the substrate during both the first and second ion implant processes. Note that the first and second ion implant processes are performed in no particular order (i.e., the first implant of block 152 may be performed before or after the second implant of block 154) unless otherwise specified in the appended claims.

Figure 2B:
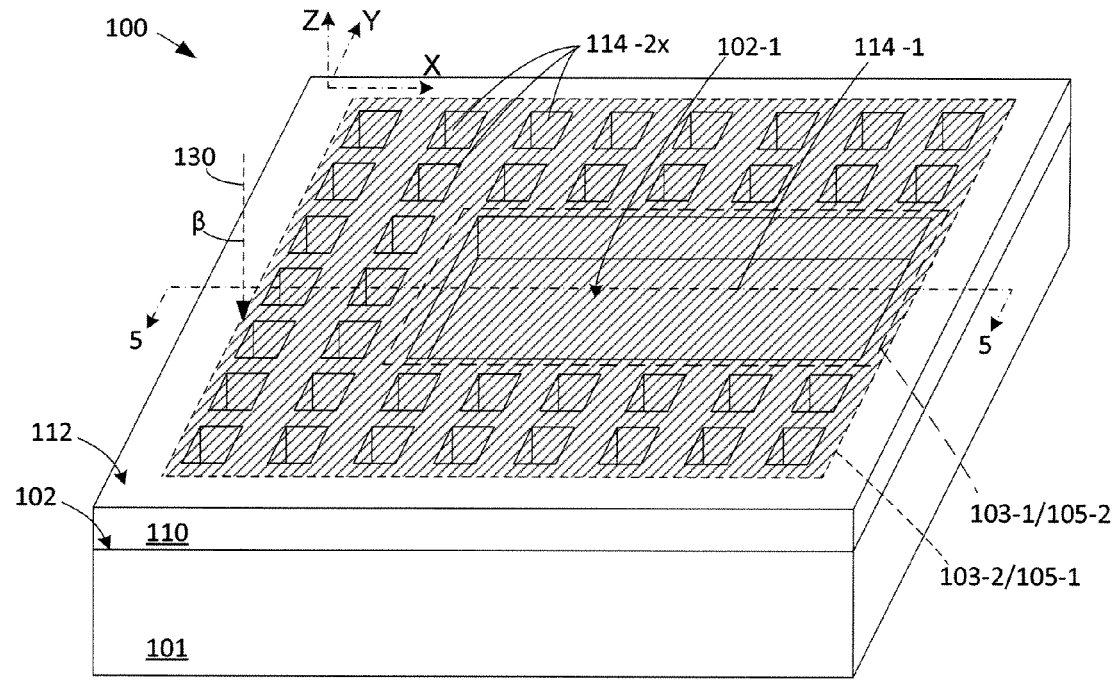

Referring to FIG. 1, according to an embodiment of the invention, the first ion implant process performed with the N-type implant (block 154), which is described with reference to FIGS. 2(B) and 3(A). As indicated in FIG. 2(B), the N-type ion implantation process involves forming N-type doped region 105-1 in substrate region 103-1, which is generally disposed under larger opening 114-1, and N-type doped regions 105-2 in substrate region 103-2, which is generally disposed under smaller openings 114-2. This doping pattern is achieved by directing the N-type ion at an angle β that is substantially perpendicular to upper surface 102 and mask surface 112. As indicated in FIG. 3(A), N-type implant material 130 directed at angle β passes through all of the openings in resist layer 111, and enters simultaneously enters first substrate region 103-1 (by way of surface region 102-1 exposed through larger opening 114-1) and second substrate region 103-2 (by way of surface regions 102-21 and 102-22, which are exposed through smaller openings 114-21 and 114-22). As such, N-type implant material 130 forms patterned implant (diffusion) regions including first portions 105-1 in substrate region 103-2 (i.e., below each smaller opening 114-2) and a second portion 105-2 in substrate region 103-1 (i.e., below larger opening 114-1). In one specific embodiment, the N-type implant process involves directing Antimony (Sb) in a range of 0° to 7° relative to perpendicular in an ion beam having an energy in the range of 50 and 90 KeV such that the second implant regions 105-1/2 have a dosage in the range of $5\times10^{15}$ and $8\times10^{15}$ cm$^{-3}$. Note that the dosage of N-type implant material in implant region 105-2 is depicted in FIG. 3(A) as being larger (deeper) than that of implant region 105-1—this higher dosage is due to ion beam portion 130-1 being directed through larger opening 114-1 into implant region 105-2. As described above, higher N-type implant dosages below the source, drain and channel region of an NLDMOS are undesirable (i.e., not wanted). In this case, however, the larger N-type implant dosage in implant region 105-2 is compensated for by the up-diffusion of the P-type implant material from implant region 104, as described below. Note that the smaller opening sizes of smaller openings 114-2 limits the N-type implant dosage to avoid this problem in implant region 105-1.

Figure 2C:
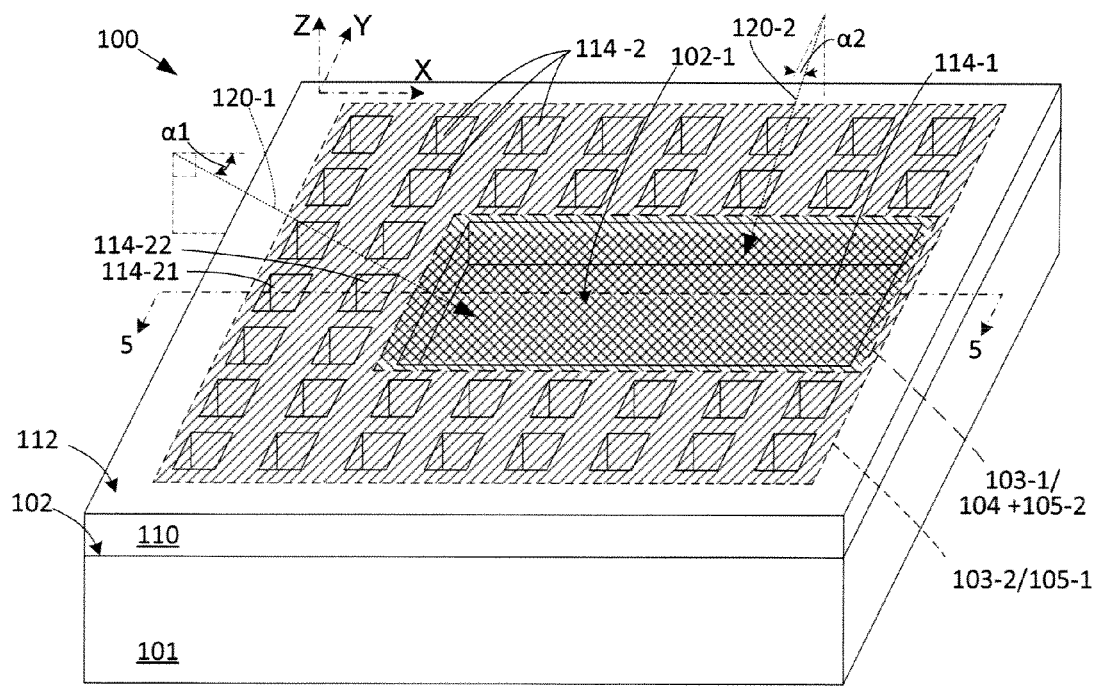

FIGS. 2(C) and 3(A) are perspective top and simplified cross-sectional views showing device 100 during the P-type ion implantation process performed in manner consistent with block 152 of FIG. 1, which in the present embodiment is the second implant process performed through shared mask 110. As indicated in FIG. 2(C), the objective of this implant process is to form a P-type (first) implant region 104 only in (first) substrate region 103-1, which is disposed below larger opening 114-1. That is, the goal of the P-type implant process is to direct the P-type dopant through larger opening 114-1, but not through smaller openings 114-2. To achieve this goal, the two types of openings are sized according to the implant process parameters (e.g., the selected implant angle α, a thickness T of shared mask 110, and the P-type implant energy) such that P-type material passes through larger opening 114-1, but is prevented from entering substrate 101 through smaller openings 114-2. For example, for a given angle α in the range of 22 to 65 degrees and for a given mask thickness T, each smaller opening 114-2 must be sized such that P-type dopant 120 is prevented from reaching substrate surface regions 102-21 and 102-22, which are disposed at the bottom of smaller openings 114-21 and 114-22 (i.e., smaller openings are required for steeper implant angles so that the mask walls defining openings 114-21 and 114-22 "shadow" substrate surface regions 102-21 and 102-22). In addition, the size of openings 114-21 and 114-22 must take into account the implant energy of P-type implant material 120—that is, a higher implant energy would require smaller width and length dimensions so that every P-type ion is required to pass through a sufficient amount of resist material before reaching upper substrate surface 102. In contrast, as illustrated in 3(A), larger openings 114-1 must be sufficiently large to allow the P-type ions directed at angle α to pass through larger opening 114-1 such that P-type implant material 120 strikes the exposed substrate surface region 102-1 located inside larger opening 114-1, whereby P-type implant material 120 forms a P-type implant region 104 in (first) region 103-1 of substrate 101. Angle α is set by positioning substrate 101 at a tilted or angled orientation relative to the Boron ion beam using techniques known in the art.

Figure 4:
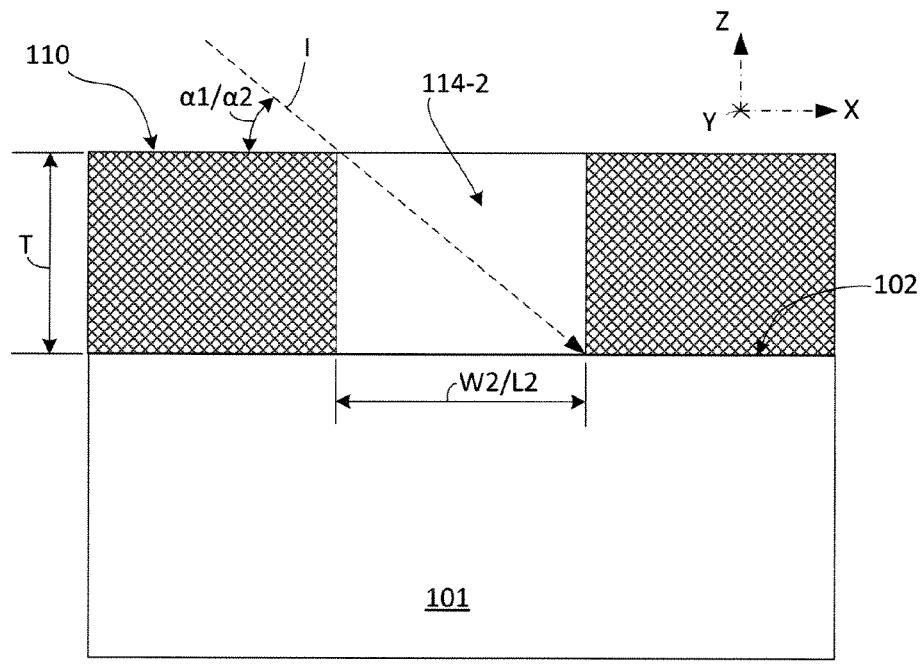
FIG. 4 is an enlarged cross-sectional view showing a single smaller opening defined in mask according to an embodiment of the invention.

FIG. 4 is an enlarged cross-sectional view showing a single smaller opening 114-2 defined in mask 110 on substrate 101 in additional detail, and illustrates a method for selecting width W2 and length L2 for a given photo resist thickness T and implant angle α1/α2. Implant I is directed toward substrate 101 at an energy level needed to produce a desired diffusion profile (e.g., a diffusion region formed deep below upper surface 102 of substrate 101 require a relatively high energy implant process, whereas a "shallow" diffusion region is formed using a relative low energy implant process). In order to cause implant material I to only enter desired regions of substrate 101, mask 110 is formed by way of a layer of photo resist material having a thickness T that is sufficient to prevent (i.e., stop) implant material I at a given implant energy from reaching substrate 101 (i.e., the implanted species will not penetrate through the photo resist), and then mask 110 is patterned using known techniques to generate sufficiently large openings over regions in which implant material I is to be implanted. In accordance with the present invention, openings 114-2 are determined by mask thickness T (which is determined by the implant energy) and the implant angle α at which implant material I is to be implanted. After mask thickness T and implant angles α1 and/or α2 are determined, length L2 and width W2 are calculated (e.g., referring to FIG. 2(C), using the formula L2≤T×Tan(α1), and W2≤T×Tan(α2)), whereby opening 114-2 has a size that prevents implant material I from directly entering substrate 101. Note that implant angle α1/α2 is set per device needs, but if it is too close to 90 degrees, width W2 and length L2 would be below the minimum design rules, and therefore not practical. Therefore, in practical embodiment using a resist thickness T in the range between 0.8 µm to 3 µm, angle implant angle α1/α2 is in the range between 22 degrees and 65 degrees, with 45 degrees being typical. Note also that, in large opening 114-1 (FIG. 2(A)), implant material I1 implanted at angle α1/α2 will be implanted and would not be blocked (as in 114-2 where I1 is blocked).

According to a preferred embodiment, the P-type implant process is performed using a Boron ion beam having an energy in the range of 20 and 100 KeV that is maintained to produce P-type implant region 104 with a dosage in the range of $1 \times 10^{13}$ cm$^{-3}$ and $5 \times 10^{14}$ cm$^{-3}$. This dosage allows the successful formation of a P+ buried layer including a P-surf region located between the NBL and deep N-well drain extended implant, thus allowing the NBL and the deep N-well to be biased separately during operation, which facilitates broadening the operation applications in which the double-RESURF LDMOS transistors can be used (e.g., such as in an application using a negative drain voltage or a negative substrate voltage).

Referring again to FIG. 2(C), an advantage of the first embodiment is that larger opening 114-1 facilitates performing the P-type ion implantation process from any X-Y direction (i.e., with substrate 101 in any tilt angle position around the Z-axis). That is, as indicated at the left side of FIG. 2(C), the P-type ion implantation process is effectively performed with substrate 101 in a tilt angle position in which an ion beam 120-1 is directed at angle α1 (i.e., parallel to the X-Z plane) onto mask 110 (i.e., the P-type implant material of ion beam 120-1 enters larger opening 114-1 and is prevented from entering smaller openings 114-2). In addition, as indicated at the top portion of FIG. 2(C), the P-type ion implantation process is also effectively performed with substrate 101 in a tilt angle position in which an ion beam 120-2 is directed at angle α2 (i.e., parallel to the Y-Z plane) onto mask 110 (i.e., the P-type implant material of ion beam 120-2 also enters larger opening 114-1 and is prevented from entering smaller openings 114-2). That is, by forming larger opening 114-1 with both width dimension W1 and length dimension L1 that are larger that width W2 and length L2 of smaller openings 114-2, the ion implantation process is made easier by allowing substrate 101 to have essentially any tilt angle position relative to the ion beam, thus simplifying the modified implant process.

The shared mask and implant techniques described with reference to FIGS. 2(A)-2(C), 3(A) and 3(B) may be modified to utilize additional techniques and mask opening patterns. For example, the implant power utilized during the P-type and N-type implant processes is controllable by adjusting the thickness of mask 110 and the size of openings 114-1 and 114-2. That is, the openings formed in the shared mask may be made larger or smaller to control the effective implant dose without adjusting the power supplied to the ion source or accelerator.

Figure 3C:
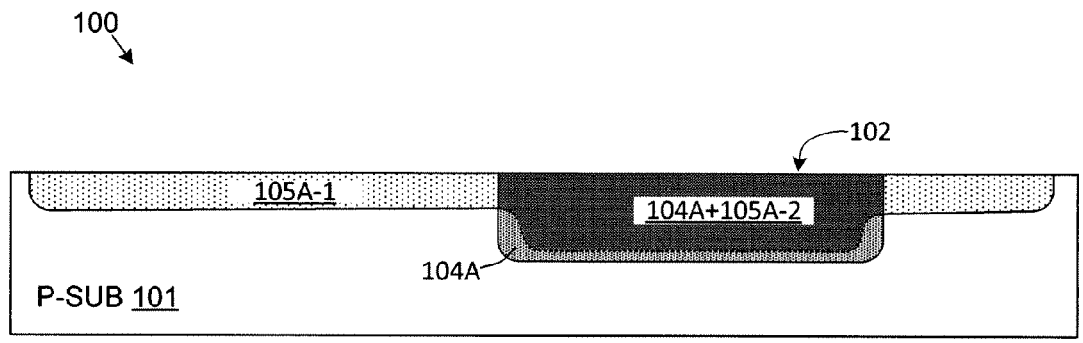

FIG. 3(C) shows device 100 after the shared mask is subsequently removed from substrate surface 102 (block 155, FIG. 1), and after substrate 101 is subsequently annealed such that the N-type implant material forming localized implant regions 105-1 and 105-2 (see FIG. 3(B)) diffuse through substrate 101 to form a continuous N+ implant region including a relatively shallow portion 105A-1 and a relatively deep portion 105A-2. In effect, this anneal causes the N-type implant material to diffuse through the regions previously protected by the mask walls, thereby forming a continuous implant (diffusion) that occupies the entire first region 103-1 and second region 103-2 of the substrate. Note that if this anneal is performed before the shared mask were removed, the N-type material would diffuse under the mask walls. The P-type implant material also diffuses into substrate 101, forming P-type implant region 104A that "overlaps" relatively deep N-type diffusion portion 105A-2 (i.e., the relatively dark-shaded region in FIG. 3(C) depicts the overlapped region including P-type implant region 104A and N-type diffusion portion 105A-2).

Figure 3D:
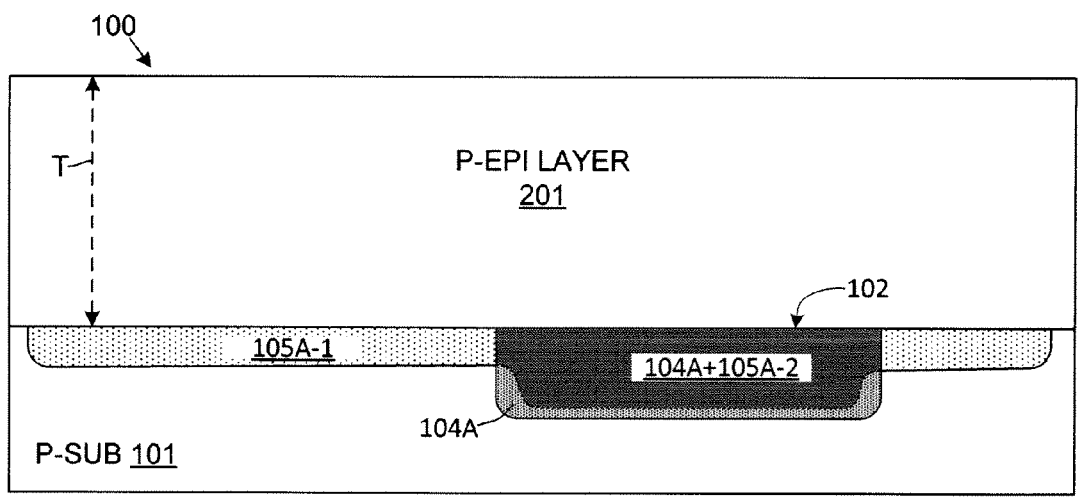

FIG. 3(D) shows device 100 after an epitaxial silicon layer 201 is grown over upper surface 102 of base structure (P-sub) 101 (i.e., epitaxial layer 201 is formed over the patterned N-type and P-type implant regions; see block 156, FIG. 1). In one embodiment, epitaxial silicon layer 201 has a thickness T of about 6 microns (i.e., in the range of 4 to 15 microns) and a resistivity of about 10 Ohm-cm (i.e., in the range of 1 to 100 Ohm-cm). Although epitaxial layer 201 has a P-type conductivity in the described embodiments, it is understood that epitaxial layer 503 can have an N-type conductivity in other embodiments.

Referring to block 158 at the lower portion of FIG. 1 and to FIG. 3(E), substrate 101 and epi layer 201 are subsequently annealed such that the P-type implant material forming implant region 104 (see FIG. 3(D)) and the N-type implant material forming implant regions 105-1 and 105-2 (see FIG. 3(D)) "up-diffuse" from substrate 101 into the lower portion of epitaxial layer 201 to form the desired "double-RESURF" buried layer arrangement. In particular, the anneal (which may be performed as a separate step or as part of the overall thermal budget utilized during the subsequent CMOS process flow, such as during a N-well drive occurring after the N-well implant process, described below) is performed such that the P-type implant material diffuses upward from first region 103-1 into the epitaxial layer 201 to form (first) P+ buried layer 256, and such that the N-type implant material forming N-type implant regions 105-1 and 105-2 diffuses from first and second regions 103-1 and 103-2 into the epitaxial layer 201 to form N+ buried layer 250. In one embodiment, this anneal process is performed by subjecting substrate 101 and epitaxial silicon layer 201 to a temperature in the range of 1100° C. and 1250° C. (e.g., approximately 1190° C.) for a period in the range of 60 and 500 minutes (e.g., approximately 120 minutes), which is optimized to cause the N+ and P+ implants described above to diffuse upward into epitaxial silicon layer 201 at an optimal rate and distance, thereby forming P+ buried layer 256 and N+ buried layer 250.

Figure 3E:
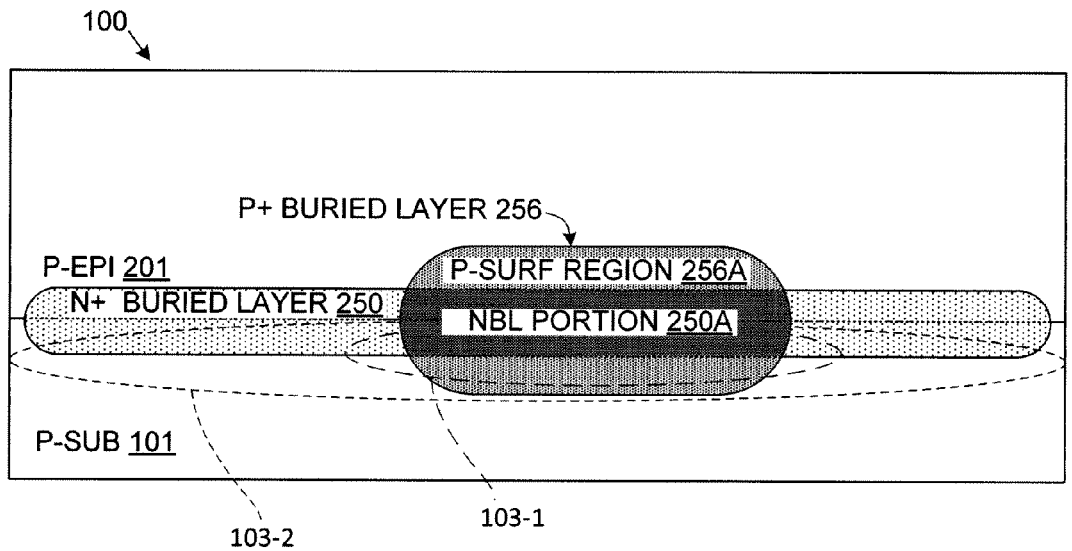

According to an aspect of the present invention depicted in FIG. 3(E), the selected P+ implant material (e.g., Boron) diffuses at a faster rate than the N+ implant material (e.g., Sb), and as such P+ buried layer 256 "overlaps" a NBL portion 250A of N+ buried layer 250, and forms a P-surf implant region 256A that is disposed above NBL portion 250A (i.e., above N+ buried layer 250). Referring to FIG. 3(E), for illustrative purposes the portions of epitaxial layer 201 and substrate 101 that are doped only with P-type implant material are indicated by relatively light shading, and "overlap" NBL region 250A (i.e., the region containing both N-type and P-type implant material) is indicated by relatively dark shading. Those skilled in the art understand that the actual regions occupied by the implant material may vary from those depicted in FIG. 3(E), and that a small amount of N-type material may be present in P-surf region 256A. However, due to the faster diffusion rate of the P-type material than the N-type material, it is understood that a substantially higher percentage of P-type implant material diffuses into P-surf region 256A, whereby P-surf region 256A takes on electrical characteristics associated with typical P-type doped semiconductor regions. A similar P-type doped region is also present in the lower layer of P+ buried layer 256 (i.e., below NBL region 250A).

Figure 3F:
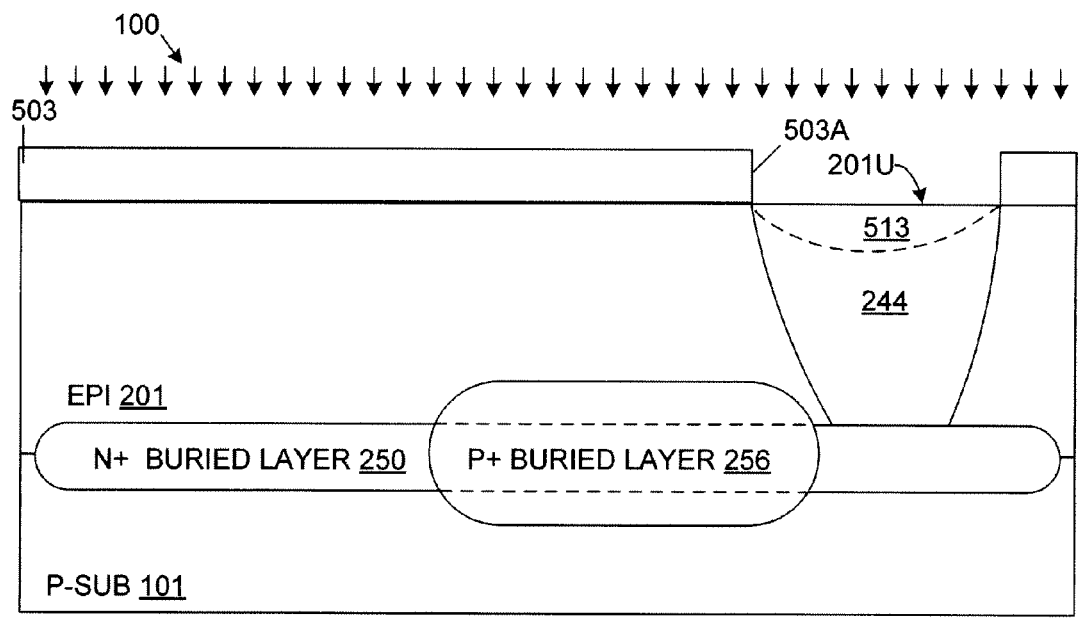

As illustrated in FIG. 3(F), a sinker mask 503 is then formed over upper surface 201U of epitaxial layer 201 using conventional photolithography, where sinker mask 503 defines an opening 503A that exposes the general location where N-type sinker region 244 is to be formed. An N-type dopant material is then directed onto mask 503 and enters substrate 101 through opening 503A, thereby forming an N-type implant in region 513 in epitaxial layer 201. In one embodiment, the N-type implant is performed by implanting Phosphorous at a dosage of about $3\times10^{15}$ cm$^{-3}$ and an energy of about 100 KeV. A suitable sinker drive anneal process is then performed (e.g., by subjecting substrate 101 and epitaxial silicon layer 201 to a temperature of approximately 1160° C. for a period of approximately 360 minutes) to cause diffusion of the N-type implant to form sinker region 244 extending through epi layer 201 between upper surface 201U and N-type buried layer 250.

Figure 3G:
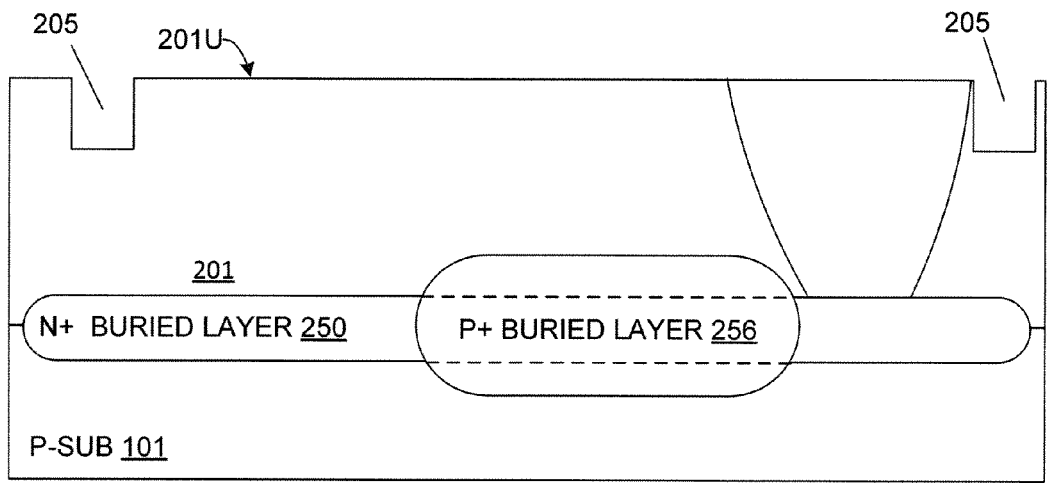

FIG. 3(G) depicts subsequent active area lithography that is then performed, wherein the active area lithograph is aligned with the previously formed zero layer patterns. In one embodiment, the active area lithography process defines trenches 205 into upper surface 201U of epitaxial layer 201 the areas where field dielectric regions are subsequently formed.

Figure 3H:
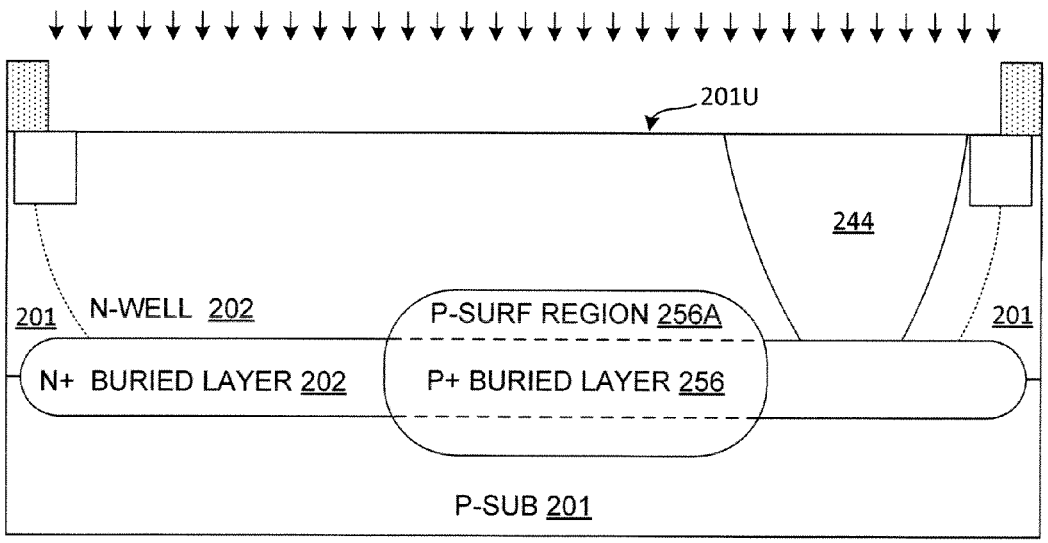

As illustrated in FIG. 3(H), a high voltage N-well implant is then performed in epitaxial layer 201 by masking, implant, and thermal diffusion according to known techniques to form high-voltage N-well implant 202, which extends from upper surface 201U to N+ buried layer 250, over P-surf region 256A of P+ buried layer 256, and to sinker region 244.

Figure 3I:
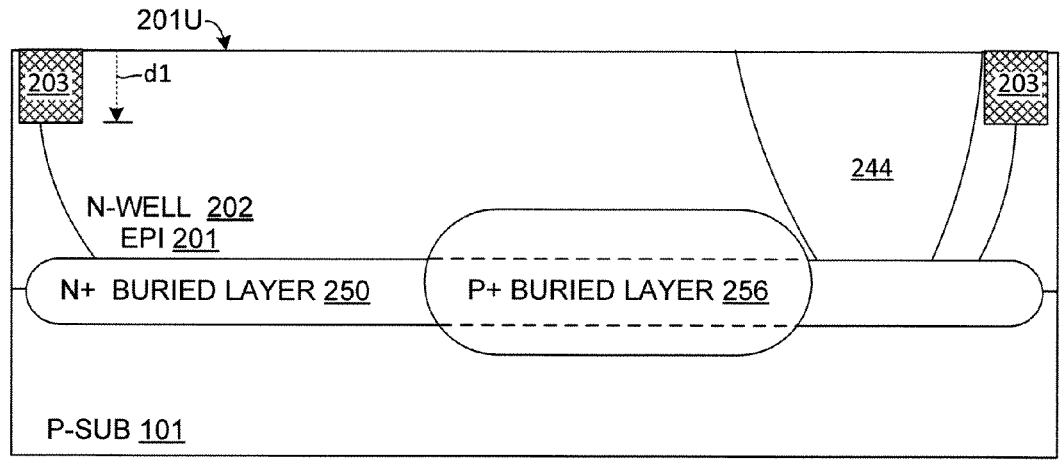

As illustrated by FIG. 3(I), field dielectric regions 203 are simultaneously formed through upper surface 201U in epitaxial layer 201, using conventional processing steps. Field dielectric regions can be, for example, shallow trench isolation (STI) regions, local oxidation of silicon (LOCOS) regions, or poly buffered local oxidation of silicon (PBLOCOS) regions. In the described example, STI regions 203 have a depth of about 3500 Angstroms, although other depths are possible. Field dielectric regions 203 define the location of double-RESURF LDMOS transistor 100.

Figure 3J:
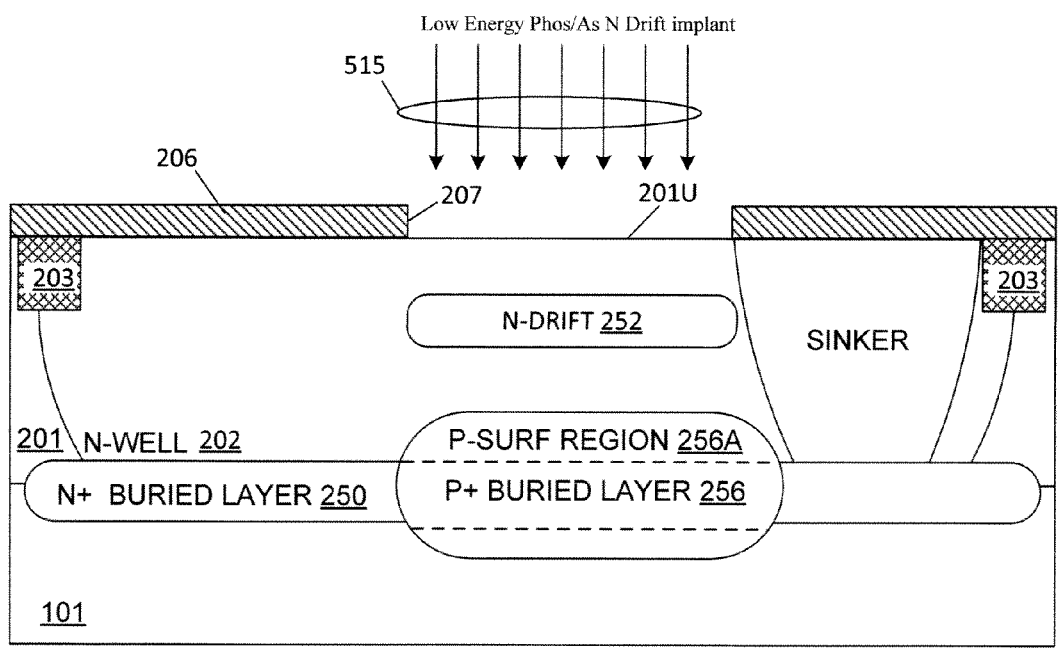

FIG. 3(J) illustrates a drift mask 206 formed on upper surface 201U that defines an opening 207 generally defining the source/channel drain region of the NLDMOS that is to be subsequently formed. FIG. 3(J) also shows a low energy implant process in which an N-type implant material 515 (e.g., Phosphorus or Arsenic) is directed through opening 207 into the portion of N-well region 202 disposed below opening 207, thereby forming N-type drift (N-drift) implant region 252 at a relatively shallow distance below the upper surface 201U of epitaxial layer 201 and over P-surf region 256A. In one embodiment, the N-drift implant is performed by implanting Phosphorous at a dosage of about $6\times10^{12}$ cm$^{-3}$ and an energy of about 1600 KeV.

Figure 3K:
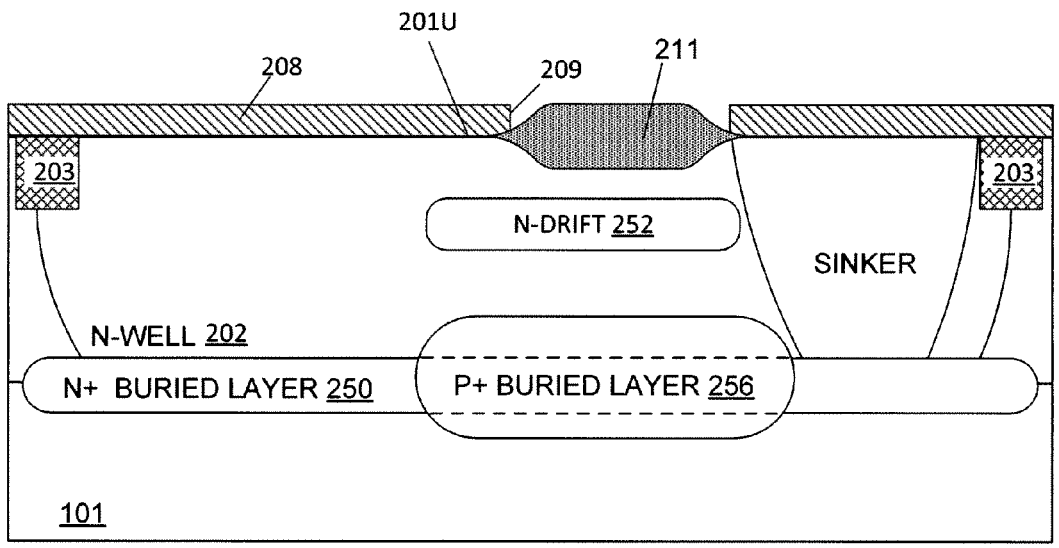
Figure 3L:
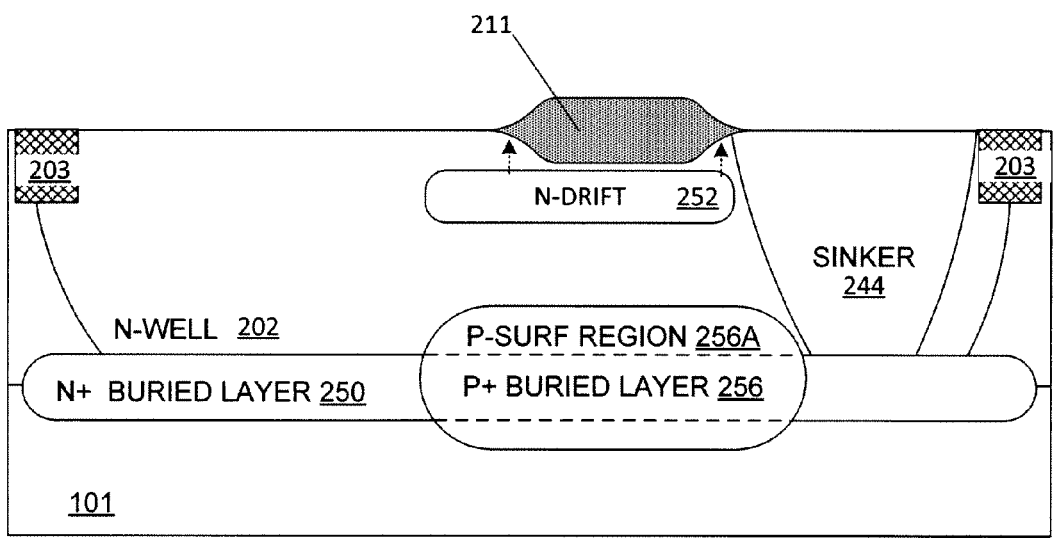

Referring to FIG. 3(K), the drift mask is then removed and a gate oxide mask 208 is formed on upper surface 201U defining an opening 209, which is generally aligned with a portion of N-drift implant region 252. A thermal oxidation process is then performed to form a LOCOS gate oxide (isolation layer) structure 211 on the portion of N-well region 202 located at upper surface 201U and exposed through opening 209. In the described embodiment, gate oxide structure 211 has a total thickness of about 120 Angstroms. As shown in FIG. 3(L), the gate oxide mask is then removed from upper surface 201U, and a rapid thermal anneal (RTA) is performed such that the n-type implant material forming the N-drift implant region 252 diffuses upward toward gate oxide structure 211 (e.g., as indicated by the dashed-line arrows in FIG. 3(L)). This temperature ramp process is performed to tailor the N-drift concentration profile to achieve lowest $R_{DSON}$ without compromising BV.

Figure 3M:
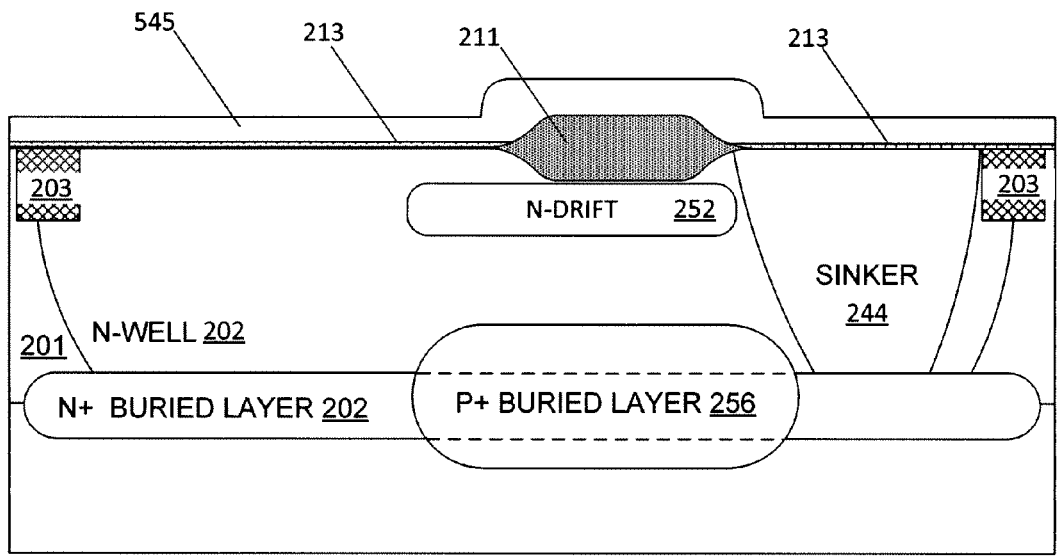

As illustrated in FIG. 3(M), gate oxide layers 213 are then formed over the upper surfaces of epi layer 201 on the source and drain region sides of gate oxide structure 211. In the described embodiment, gate oxide layer 213 is thicker than the gate dielectric layers of typical "low power" CMOS transistors formed by the otherwise-standard CMOS process flow, thereby enabling LDMOS transistor 100 to operate in response to relatively high voltages. For example, gate dielectric layer 213 may include 120 Angstroms of thermally grown silicon oxide, in comparison to 30 Angstroms of thermally grown silicon oxide for "low power" CMOS transistors. Referring again to FIG. 3(M), a conductively doped polysilicon layer 545, which will eventually form gate electrode 245 of LDMOS transistor 100 (and the gate electrodes of other transistors formed on epi layer 201), is then formed over gate dielectric layer 213 and gate oxide structure 211 using known techniques.

Figure 3N:
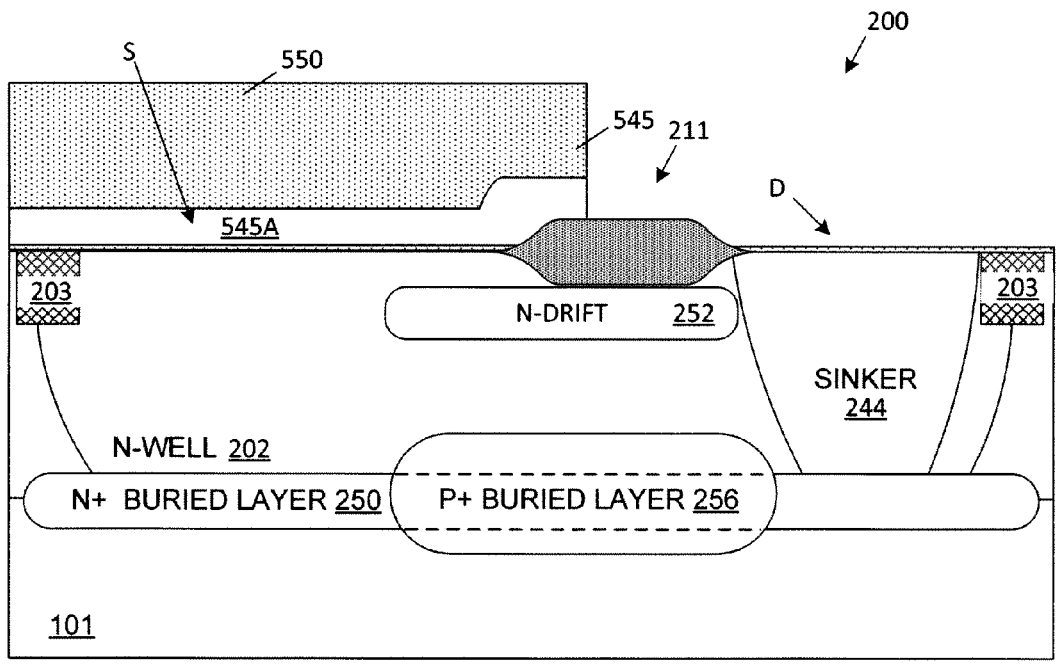

As shown in FIG. 3(N), a first gate line photoresist mask 550 is then formed over polysilicon layer 545, and a first etch is performed through the openings of first gate line mask 550 to remove the portion of polysilicon layer 525 located over a portion of gate oxide structure 211 and over the drain (D) side of LDMOS transistor 100. Note that gate line mask 550 covers the source side of LDMOS transistor 100, such that polysilicon region 545A remains over the source (S) side after the first etch is completed.

Figure 3O:
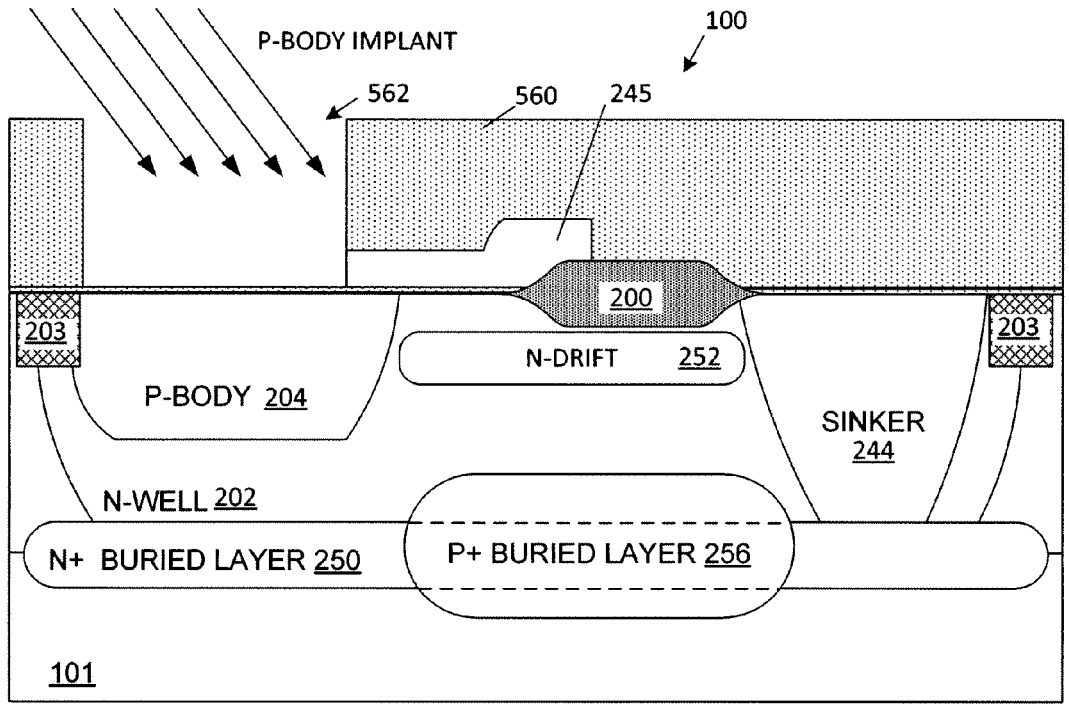

As illustrated in FIG. 3(O), the first gate line photoresist mask is then removed, and a second gate line photoresist mask 560 is formed over the resulting structure. The second gate line mask 560 defines an opening 562 that exposes a portion of the polysilicon layer located over the source side of LDMOS transistor 100. An etch is then performed through opening 562 of the second gate line photoresist mask 560, thereby removing the exposed portions of the polysilicon layer, whereby the remaining portion of etched polysilicon layer forms gate electrode 245 of LDMOS transistor 100.

As also indicated in FIG. 3(O), a p-type body implant is then performed at an angle through opening 562 of second gate line mask 560, thereby forming p-body implant 204 (i.e., such that p-type body implant 204 is aligned with the left-side edge of gate electrode 245 by way of being implanted through opening 562 of second gate line photoresist mask 560). The p-type body implant is described in more detail in commonly owned U.S. patent application Ser. No. 11/691,459, which is hereby incorporated by reference.

Figure 3P:
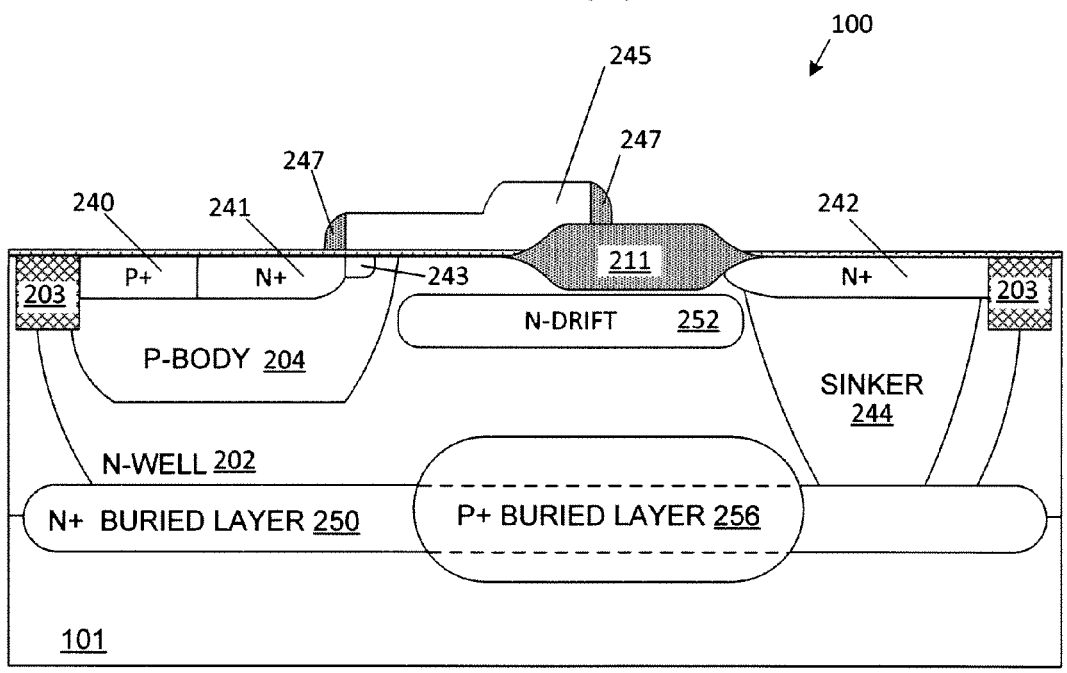

The second gate line mask 560 is then stripped, and conventional CMOS front-end and back-end processes are used to complete LDMOS 100 according to known techniques. More specifically, referring to FIG. 3(P), source/drain extension implants are performed to create lightly doped source extension region 243 in LDMOS transistor 100. Dielectric sidewall spacers 247 are then formed adjacent to the gate electrodes, including gate electrode 245 of LDMOS transistor 100. A P+ implant is performed to create p-type source/drain contact regions (e.g., p+ body contact region 240), and an N+ implant is performed to create n-type source/drain contact regions (e.g., N+ contact regions 241 and 242, which are respectively formed on the source and drain sides of LDMOS 100).

Figure 3Q:
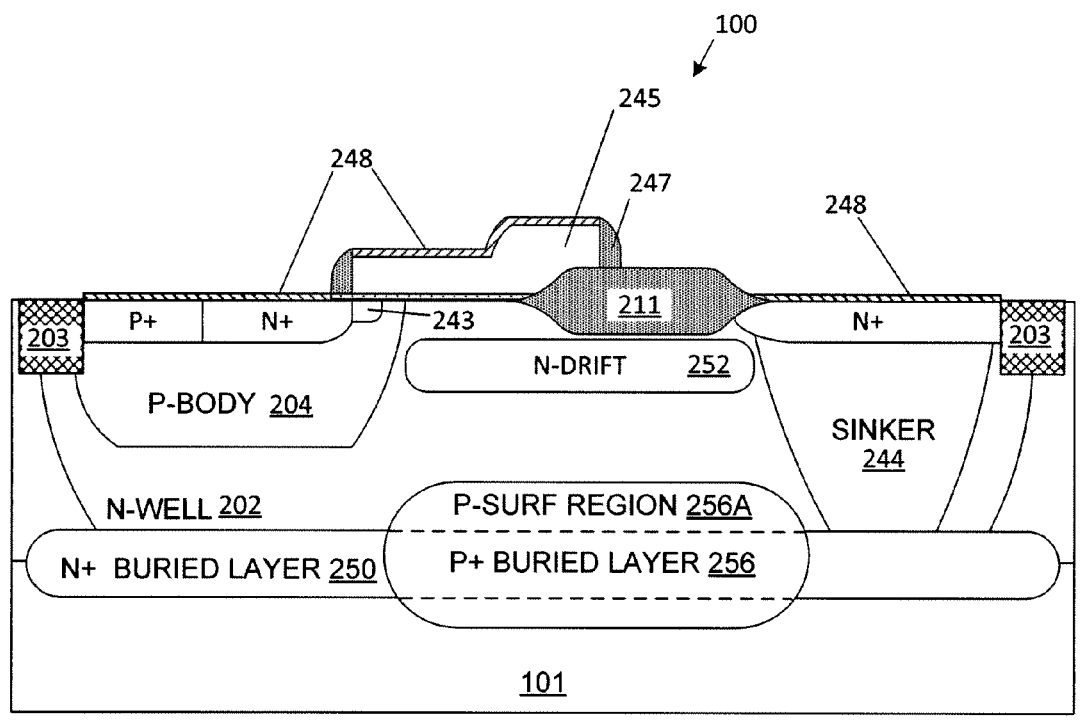

The substantially completed double-RESURF NLDMOS 100 is shown FIG. 3(Q), after the exposed portions of the gate oxide regions located over the source and drain portions of LDMOS 100 are then removed, and metal salicide regions 248 are formed over the resulting source and drain regions, and over gate structure 245, using a conventional salicide process. A standard CMOS process is then used to form the remaining backend structures (e.g., contacts, metals and vias), which are not shown for the sake of brevity. Note that completed double-RESURF NLDMOS 100 is characterized by P+ buried layer 256, which overlaps a portion of N+ buried layer 250 and includes P-surf region 256A that is disposed between N+ buried layer 250 and N-drift region 252. The presence of P-surf region 256A provides double-RESURF NLDMOS 100 with a higher BV and lower than benchmark $R_{DSON}$ as that of a conventional NLDMOS having the same footprint size. The fabrication method described above facilitates the formation of P-surf region 256A using a cost effective method (i.e., by eliminating the cost of providing a separate mask for generating the P+ buried layer), and avoids the problems associated with the conventional approach of implanting P-type material from the top (e.g., by facilitating patterning of P+ buried layer 256 independent from N+ buried layer 250 in order to optimize the BV Vs. $R_{DSON}$ characteristics of double-RESURF NLDMOS 100.

Figure 5:
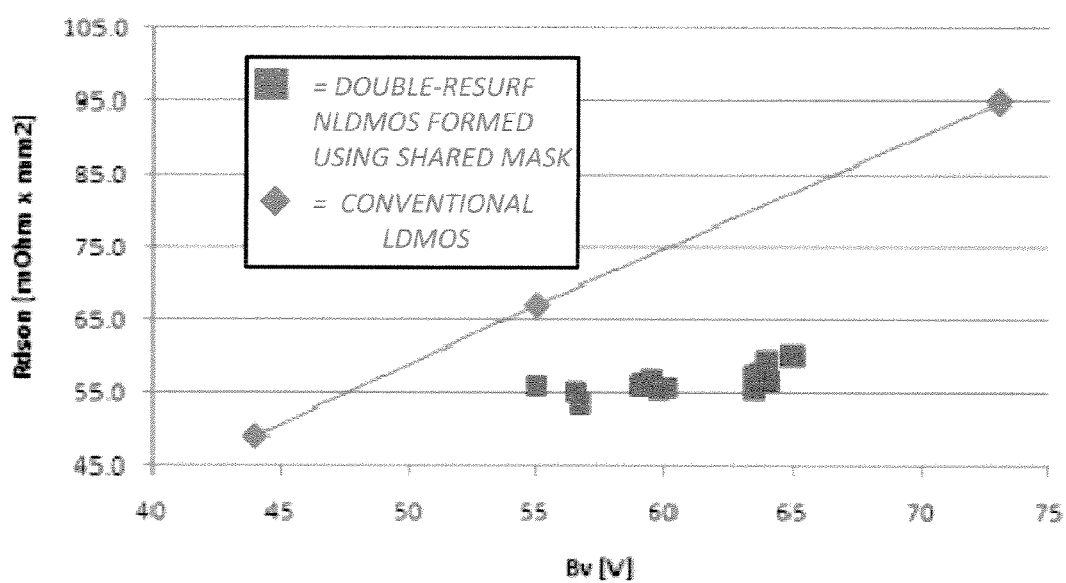
FIG. 5 is a chart showing measured performance characteristics of double-RESURF LDMOS transistors formed in accordance with the present invention.

Table 1 below compares the on-resistance ($R_{DSON}$) of a non-RESURF LDMOS transistor with double-RESURF LDMOS transistor 100, which is processed in accordance with the steps described in FIGS. 3(A) to 3(Q) above. Both LDMOS structures are formed such that their breakdown voltage BV is 64 Volts. The double-RESURF architecture formed in accordance with the present invention improves $R_{DSON}$ to breakdown voltage (BV) by approximately a factor of two. FIG. 5 is a chart demonstrating how the double-RESURF architecture of the present invention results in lower $R_{DSON}$ for a given breakdown voltage over non-RESURF LDMOS. The chart indicates that the methodology of the present invention facilitates forming smaller double-RESURF LDMOS devices (i.e., lower specific $R_{DSON}$) while maintaining the same BV of a large device.

TABLE 1

| Parameter | CONVENTIONAL NBL LDMOS BV = 64 V | Double RESURF NBL + PBL LDMOS BV = 64 V | $R_{DSON}$ Ratio |
|---|---|---|---|
| $R_{DSON}$ | 95 mΩ * mm² | 55 mΩ * mm² | 1.72 |

Figure 6:
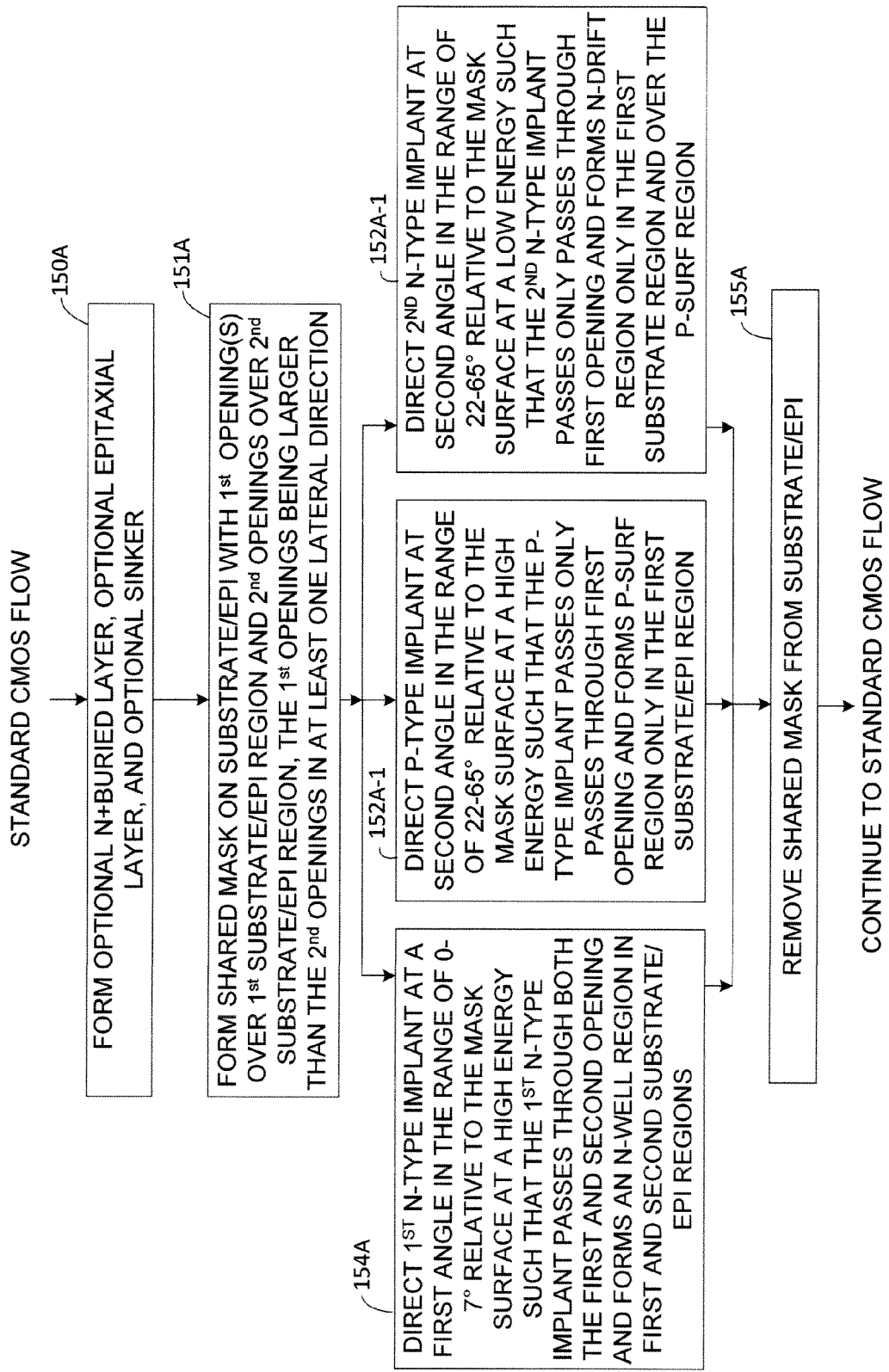
FIG. 6 is a simplified flow diagram showing a generalized method for producing a double-RESURF LDMOS transistor according to another embodiment of the present invention.
Figure 7:
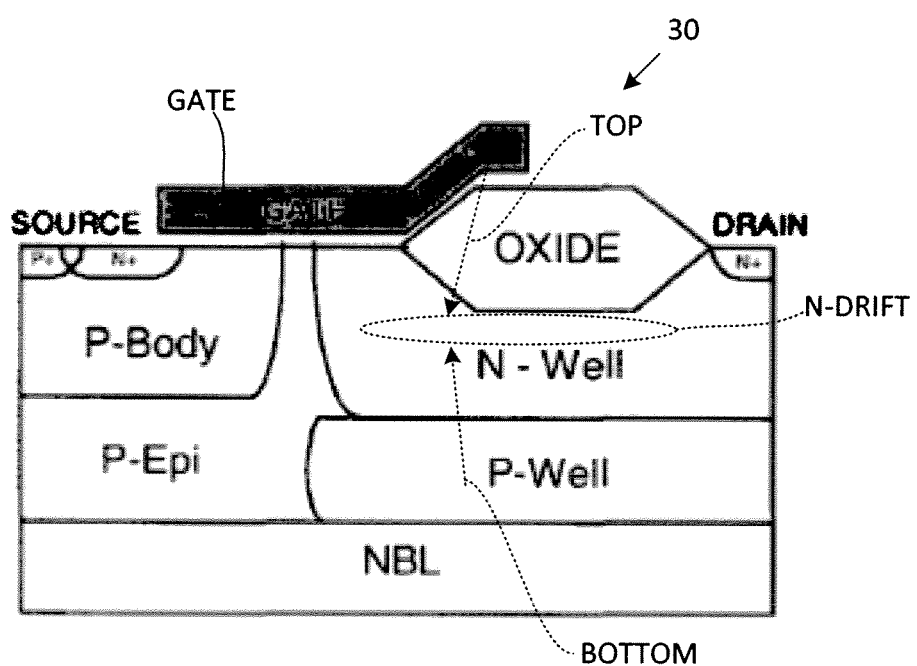
FIG. 7 is a cross-sectional view showing a conventional double-RESURF LDMOS transistor.

FIG. 6 is a simplified flow diagram showing a method for fabricating a double-RESURF LDMOS transistor similar to that shown in FIG. 3(Q) that does not require the use of separate masks to form P-surf region 256A and N-drift region 252. As indicated in block 150A of FIG. 6, the method begins by forming an optional N+ buried layer implant is first formed in a base semiconductor substrate using a first mask, then the epitaxial layer is deposited over the N+ buried layer implant, and then an optional sinker implant to the N+ buried layer is formed through the epi layer using a second mask. As indicated in block 151A, a mask similar to that shown and described above with reference to FIGS. 2(A) and 3(A) is then formed on the epi layer (i.e., mask 110 consisting of a mask material resist layer 111 defining both at least one first large opening 114-1 having a wide/large size located over a first region, and an array of smaller openings 114-21 and 114-22 (e.g., cell-type/small openings) disposed over a second region). As indicated in blocks 154A, 152A-1 and 152A-2, three separate implant processes are then performed using the methodologies described above. Referring to block 154A, which corresponds to the methodology shown and described with reference to FIGS. 2(A) and 3(A), a first N-type implant material is directed onto the mask/substrate at a first angle β in the range of 0-7° at a high energy such that the first N-type implant material 130 passes through both larger openings 114-1 and smaller openings 114-21/114-22 to form an N-well region (e.g., region 202 in FIG. 3(Q)) in both the first and second regions of the epi layer. Referring to block 152A-1, which corresponds to the methodology shown and described with reference to FIGS. 2(B) and 3(B), during a second implant process a P-type implant material 120 is directed onto the mask at a second angle (e.g., α1 in FIG. 3(B)) in the range of 22-65' and at a first implant energy such that the P-type implant material 120 only passes through larger opening 114-1, and such that the implanted P-type material forms a P-surf region (e.g., 256A in FIG. 3(Q)) only in first region of the epi layer and such that the P-surf region is disposed over the N+ buried layer. Referring to block 152A-2, which also corresponds to the methodology shown and described with reference to FIGS. 2(B) and 3(B), during a third implant process a second N-type implant material (which can be the same as that used to form the N+ buried layer) is directed onto the mask at a third angle (e.g., α2 in FIG. 3(B)) in the range of 22-65° and at a second implant energy such that the N-type implant material only passes through larger opening 114-1, and such that the implanted N-type material forms an N-drift region (e.g., 252 in FIG. 3(Q)) only in the first region of the epi layer and such that the N-drift region is disposed over the P-surf region. As indicated in block 155A, the shared mask is then removed from the substrate using the techniques described above, and then the CMOS process continues with the process described above starting at FIG. 3(K).

In another alternative embodiment, the use of a single shared mask to form N-well, P-surf and N-drift regions is utilized without first forming an epi layer. In this case, an N+ buried layer is omitted from the process, and the shared mask is formed on an upper surface of the base semiconductor (e.g., monocrystalline silicon) substrate. The three implants described above are then performed, the shared mask is removed, and then processing is continued using a standard LDMOS-CMOS process flow.

Although the invention has been described in connection with several embodiments, it is understood that this invention is not limited to the embodiments disclosed, but is capable of various modifications, which would be apparent to a person skilled in the art. For example, the conductivity types (i.e., N-type or P-type) of the various semiconductor regions can be reversed with similar results. Moreover, a bump-type gate oxide may be formed and utilized in place of LOCOS gate oxide 211 as described in co-owned and co-pending U.S. patent application Ser. No. 14/080,758, entitled "DOUBLE RESURF LDMOS WITH DRIFT AND PSURF IMPLANTS SELF-ALIGNED TO A STACKED GATE "BUMP" STRUCTURE", which is incorporated herein by reference in its entirety. Thus, the invention is limited only by the following claims.

We claim:

1. A method for fabricating a double-RESURF LDMOS transistor including an N+ buried layer and a P-surf region disposed over the N+ buried layer, the method comprising:

forming a mask on a surface of a substrate, the mask consisting of a mask material layer defining both at least one first opening disposed over a first region of the substrate, and a plurality of second openings disposed over a second region of the substrate, wherein the first opening is larger than each of the second openings in at least one direction;

directing a P-type implant material and an N-type implant material onto the mask, a first implant material of said P-type and N-type implant materials being directed at a first angle onto the mask such that the first implant material only passes through the at least one first opening and forms a first implant region only in the first region of the substrate, and a second implant material of said P-type and N-type implant materials being directed at a second angle such that the second implant material passes through both said at least one first opening and said plurality of second openings such that subsequent annealing causes the second implant material to form a second implant region disposed in both the first region and the second region of the substrate;

forming an epitaxial layer on the substrate over the first and second implant regions; and annealing the substrate such that the first implant material forming the first implant region diffuses from the first region into the epitaxial layer to form a first buried layer of a P+ buried layer and said N+ buried layer, and such that the second implant material forming the second implant region diffuses from the first and second regions into the epitaxial layer to form a second buried layer of said P+ buried layer and said N+ buried layer, wherein the P-type implant material forming the P+ buried layer form a P+ buried layer including a P-surf region disposed between the N+ buried layer and an upper surface of the epitaxial layer.

2. The method of claim 1, wherein forming the mask comprises depositing a resist material layer on the surface of the substrate, and patterning the resist material layer such that the plurality of second openings comprise a plurality of substantially square openings disposed in an array pattern.

3. The method of claim 2, wherein directing the first implant material comprises directing the first implant material at an angle in the range of 22 to 65 degrees relative to a plane defined by an upper surface of the mask; and wherein directing the second implant material comprises directing the second implant material at an angle in the range of 0 to 7 degrees relative to a perpendicular to the plane defined by the upper surface of the mask.

4. The method of claim 3, wherein directing the first implant material comprises directing a P-type implant material at the first angle onto the mask, and wherein directing the second implant material comprises directing an N-type implant material at the second angle onto the mask.

5. The method of claim 3, wherein directing the first implant material comprises directing Boron at the first angle onto the mask, and wherein directing the second implant material comprises directing Antimony at the second angle onto the mask.

6. The method of claim 5, wherein directing the Boron at the first angle onto the mask comprises directing the Boron in a first ion beam having an energy in the range of 20 and 100 KeV, and maintained such that the first implant region has a dosage in the range of $1 \times 10^{13}$ cm$^{-3}$ and $5 \times 10^{14}$ cm$^{-3}$, and wherein directing the Antimony at the second angle onto the mask comprises directing the Antimony in a second ion beam having an energy in the range of 50 and 90 KeV such that the second implant regions have a dosage in the range of $5 \times 10^{15}$ and $8 \times 10^{15}$ cm$^{-3}$.

7. The method of claim 6, wherein forming the epitaxial layer comprises forming a layer of epitaxial silicon having a P-type conductivity and a thickness in the range of 4 to 15 microns and a resistivity in the range of 1 and 100 Ohm-cm.

8. The method of claim 7, wherein annealing the substrate comprises heating the substrate and epitaxial silicon layer to a temperature of 1100 and 1250° C. for a period in the range of 60 and 500 minutes.

9. The method of claim 7, further comprising forming an N-type sinker extending through the epitaxial silicon layer to said N+ buried layer.

10. The method of claim 9, further comprising forming an N-well implant extending through the epitaxial silicon layer to said N+ buried layer, wherein said N-well implant extends from said sinker region over the buried layer and the P+ buried layer.

11. The method of claim 10, further comprising forming an N-drift implant region in said N-well implant above the P-surf region, and then forming a gate oxide structure on a portion of the epitaxial silicon layer disposed over the N-drift implant region.

12. The method of claim 11, further comprising forming a polycrystalline silicon gate structure on a portion of the epitaxial silicon layer and on a portion of the gate oxide structure, and forming source and drain implants in the epitaxial layer on opposing sides of the polycrystalline silicon gate structure.

13. A method for fabricating a double-RESURF N-type laterally diffused metal oxide semiconductor (NLDMOS) transistor, the method comprising:

forming a mask on a surface of a substrate, the mask consisting of a mask material layer defining both a first opening disposed over a first region of the substrate, and a plurality of second openings disposed over a second region of the substrate, wherein the first opening is larger than each of the second openings in at least one direction;

directing a P-type implant material and an N-type implant material onto the mask, the P-type implant material being directed at a first angle onto the mask such that the P-type implant material only passes through the first opening and forms a first implant region only in the first region of the substrate, and the N-type implant material being directed at a second angle such that the N-type implant material passes through both said first opening and said plurality of second openings, and such that subsequent annealing causes the N-type implant material to form a second implant region disposed in both the first region and the second region of the substrate;

forming an epitaxial layer on the substrate over the first and second implant regions; and annealing the substrate such that the N-type implant material forming the second implant region diffuses from the first and second regions into the epitaxial layer to form an N+ buried layer, and such that the P-type implant material forming the first implant region diffuses from the first region into the epitaxial layer to form a P+ buried layer that intersects a portion of the N+ buried layer and includes a P-surf region disposed between said N+ buried layer portion and an upper surface of the epitaxial layer.

14. The method of claim 13,
wherein directing the first implant material comprises directing Boron at the first angle onto the mask, and
wherein directing the second implant material comprises directing Antimony at the second angle onto the mask,
whereby said annealing causes said Boron to up-diffuse at a faster rate than said Antimony such that said P-surf implant region is formed above said N+ buried layer.

15. The method of claim 13,
wherein directing the P-type implant material comprises directing an ion beam including the P-type implant material at an angle in the range of 22 to 65 degrees relative to a plane defined by an upper surface of the mask; and
wherein directing the N-type implant material comprises directing an ion beam including the N-type implant material at an angle in the range of 0 to 7 degrees relative to a perpendicular direction relative to the plane.

16. A method for fabricating a double-RESURF NLDMOS transistor including a P-surf implant region disposed over an N+ buried layer, the method comprising:
forming a mask on a surface of a substrate, the mask consisting of a mask material layer defining both at least one first opening disposed over a first region of the substrate, and a plurality of second openings disposed over a second region of the substrate, wherein the first opening is larger than each of the second openings in at least one direction;
directing a P-type implant material and an N-type implant material onto the mask, the P-type implant material being directed at a first angle in the range of 22-65° onto the mask such that the P-type only passes through the at least one first opening and forms a first implant region only in the first region of the substrate, and the N-type implant material being directed at a second angle in the range of 0-7° such that the N-type implant material passes through both said at least one first opening and said plurality of second openings and forms a second implant region disposed in both the first region and the second region of the substrate;
forming an epitaxial layer on the substrate over the first and second implant regions; and
annealing the substrate such that the P-type implant material forming the first implant region diffuses from the first region into the epitaxial layer toward an upper surface of the epitaxial layer,
wherein the P-type implant material and the N-type implant material are selected such that the P-type implant material diffuses into the epitaxial layer at a faster rate than the N-type implant material, whereby the N-type implant material forms said N+ buried layer in the epitaxial layer, and said P-type implant material forms said P-surf implant region between the N-type implant material and the upper surface of the epitaxial layer.

17. The method of claim 13,
wherein directing the first implant material comprises directing Boron at the first angle onto the mask, and
wherein directing the second implant material comprises directing Antimony at the second angle onto the mask,
whereby said annealing causes said Boron to up-diffuse at a faster rate than said Antimony such that said P-surf implant region is formed above said N+ buried layer.

18. The method of claim 16,
wherein directing the P-type implant material comprises directing an ion beam including the P-type implant material at an angle in the range of 22 to 65 degrees relative to a plane defined by an upper surface of the mask; and
wherein directing the N-type implant material comprises directing an ion beam including the N-type implant material at an angle in the range of 0 to 7 degrees relative to a perpendicular direction relative to the plane.

19. A method for fabricating double-RESURF LDMOS transistor including a deep N-well, a P-surf region disposed over the N+ buried layer and an N-drift region disposed over the P-surf region, the method comprising:
forming a mask on a upper surface, the mask consisting of a mask material layer defining both at least one first opening disposed over a first region, and a plurality of second openings disposed over a second region, wherein the first opening is larger than each of the second openings in at least one direction;
directing a first N-type implant material at a first angle in the range of 0-7° onto the mask such that the N-type implant material passes through both said at least one first opening and said plurality of second openings and the upper surface to form an N-well region in both the first region located below the at least one first opening, and in the second region located below the plurality of second openings;
directing a P-type implant material at a second angle in the range of 22-65° and at a first implant energy onto the mask such that the P-type implant material only passes through the at least one first opening and forms said P-surf region only in the first region;
directing a second N-type implant material at a third angle in the range of 22-65° and at a second implant energy onto the mask such that the second N-type implant material only passes through the at least one first opening and forms said N-drift region only in the first region of the substrate, said second implant energy being lower than said first implant energy such that said N-drift region is disposed between the P-surf region and the upper surface.

20. The method of claim 19, further comprising:
forming an N+ buried layer in a semiconductor substrate;
forming an epitaxial layer on the semiconductor substrate such that an upper portion of said epitaxial layer forms said upper surface;
forming said mask on the epitaxial layer; and
directing said first N-type implant material, said P-type implant material and said second N-type implant material such that said N-well region, said P-surf region and said N-drift region are implanted into said epitaxial layer.

21. The method of claim 19,
wherein forming said mask comprises forming said mask on a semiconductor substrate, and
wherein directing said first N-type implant material, directing said P-type implant material and directing said second N-type implant material comprises forming said N-well region, said P-surf region and said N-drift region in said semiconductor substrate.

\* \* \* \* \*